United States Patent
Shin et al.

(10) Patent No.: US 12,520,691 B2
(45) Date of Patent: Jan. 6, 2026

(54) ELECTRONIC DEVICE INCLUDING IN-DISPLAY OPTICAL SENSOR

(71) Applicant: Samsung Electronics Co., Ltd., Gyeonggi-do (KR)

(72) Inventors: Sungyoung Shin, Gyeonggi-do (KR); Minsuk Uhm, Gyeonggi-do (KR); Dongseop Lee, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 538 days.

(21) Appl. No.: 17/987,039

(22) Filed: Nov. 15, 2022

(65) Prior Publication Data
US 2023/0070304 A1 Mar. 9, 2023

Related U.S. Application Data

(63) Continuation of application No. PCT/KR2022/002644, filed on Feb. 23, 2022.

(30) Foreign Application Priority Data

Feb. 23, 2021 (KR) .................. 10-2021-0024402
Jun. 3, 2021 (KR) .................. 10-2021-0072332

(51) Int. Cl.
*H01L 27/32* (2006.01)
*H01L 51/00* (2006.01)
(Continued)

(52) U.S. Cl.
CPC ......... *H10K 59/352* (2023.02); *H10K 59/121* (2023.02); *H10K 59/122* (2023.02);
(Continued)

(58) Field of Classification Search
CPC .... H10K 59/352; H10K 59/353; H10K 59/65; H10K 59/80515; H10K 50/813
See application file for complete search history.

(56) References Cited

U.S. PATENT DOCUMENTS 10,439,006 B2 10/2019 Jinta et al.
10,707,280 B2 7/2020 Jeong et al.
(Continued)

FOREIGN PATENT DOCUMENTS

CN 210120138 U 2/2020
CN 111029391 A 4/2020
(Continued)

OTHER PUBLICATIONS

International Searching Authority, Written Opinion of the International Searching Authority, International application No. PCT/KR2022/002644, Jun. 17, 2022, all pages. (Year: 2022).*

(Continued)

*Primary Examiner* — Victoria K. Hall
(74) *Attorney, Agent, or Firm* — Cha & Reiter, LLC

(57) ABSTRACT

An electronic device of an embodiment of the present disclosure may include an optical sensor, and an organic light emitting diode display panel that includes a first region corresponding to where the optical sensor is disposed and a second region distinct from the first region. The organic light emitting diode display panel may include first organic material arrangement regions disposed in the first region, second organic material arrangement regions disposed in the second region, first electrodes disposed on a back surface of the first organic material arrangement regions, second electrodes disposed on a back surface of the second organic material arrangement regions, and a common electrode disposed on an upper surface of the first organic material arrangement regions and the second organic material arrangement regions. An area of the first organic material arrangement regions may be larger than an area of the second organic material arrangement regions.

18 Claims, 13 Drawing Sheets

(51) Int. Cl.
*H01L 51/56* (2006.01)
*H10K 59/121* (2023.01)
*H10K 59/122* (2023.01)
*H10K 59/35* (2023.01)
*H10K 59/65* (2023.01)
*H10K 71/16* (2023.01)
*H10K 59/12* (2023.01)
*H10K 59/80* (2023.01)

(52) U.S. Cl.
CPC ........... *H10K 59/353* (2023.02); *H10K 59/65* (2023.02); *H10K 71/166* (2023.02); *H10K 59/1201* (2023.02); *H10K 59/80515* (2023.02)

(56) References Cited

U.S. PATENT DOCUMENTS

| | | | |
|---|---|---|---|
| 10,748,972 | B2 | 8/2020 | Chen et al. |
| 11,469,276 | B2 | 10/2022 | Jeon et al. |
| 2014/0312321 | A1 | 10/2014 | Yoo et al. |
| 2020/0144302 | A1 | 5/2020 | Lius et al. |
| 2020/0212147 | A1 | 7/2020 | Han et al. |
| 2020/0251539 | A1 | 8/2020 | Fu |
| 2020/0357871 | A1 | 11/2020 | Chung et al. |
| 2020/0403055 | A1 | 12/2020 | Jung et al. |
| 2021/0005683 | A1 | 1/2021 | Sung et al. |
| 2021/0195007 | A1 | 6/2021 | Her et al. |
| 2021/0202885 | A1* | 7/2021 | Cai ................... H10K 59/131 |
| 2021/0408111 | A1 | 12/2021 | Lou et al. |
| 2022/0069028 | A1* | 3/2022 | Jang ................... H10K 59/121 |
| 2022/0149120 | A1 | 5/2022 | Zhao et al. |
| 2022/0278177 | A1 | 9/2022 | Kubota et al. |
| 2022/0302406 | A1 | 9/2022 | Yee |

FOREIGN PATENT DOCUMENTS

| | | |
|---|---|---|
| CN | 111029483 A | 4/2020 |
| CN | 111146362 A | 5/2020 |
| CN | 108807489 B | 8/2020 |
| CN | 111769148 A | 10/2020 |
| JP | 2008-0269962 A | 11/2008 |
| KR | 10-1826432 B1 | 2/2018 |
| KR | 10-2018-0119198 A | 11/2018 |
| KR | 10-2031648 B1 | 10/2019 |
| KR | 10-2020-0039866 A | 4/2020 |
| KR | 10-2020-0082496 A | 7/2020 |
| KR | 10-2020-0136549 A | 12/2020 |
| KR | 10-2020-0144903 A | 12/2020 |
| KR | 10-2021-0003990 A | 1/2021 |
| KR | 10-2021-0005446 A | 1/2021 |
| KR | 10-2203421 B1 | 1/2021 |
| WO | 2021/009621 A1 | 1/2021 |

OTHER PUBLICATIONS

International Searching Authority, International Search Report, International application No. PCT/KR2022/002644, Jun. 17, 2022, all pages. (Year: 2022).*

Korean Office Action dated Jun. 25, 2025.

* cited by examiner

ELECTRONIC DEVICE INCLUDING IN-DISPLAY OPTICAL SENSOR

CLAIM OF PRIORITY

This application is a continuation of International Application No. PCT/KR2022/002644 designating the United States, filed on Feb. 23, 2022, in the Korean Intellectual Property Receiving Office and claiming priority to Korean Patent Application No. 10-2021-0024402, filed on Feb. 23, 2021, in the Korean Intellectual Property Office, and Korean Patent Application No. 10-2021-0072332, filed on Jun. 3, 2021, in the Korean Intellectual Property Office, the disclosures of which are incorporated by reference herein in their entireties.

TECHNICAL FIELD

One or more embodiments of the present disclosure generally relate to an electronic device including an in-display optical sensor.

BACKGROUND

With the development of display technology and the application thereof to electronic devices, demand for organic light emitting diode displays (OLED) is increasing.

Since the OLED displays do not require a separate light source or backlight, they are advantageous due to their lightweight and thin profile. Also, OLED displays are also widely used because they have fast response speed and excellent luminous efficiency, luminance, and viewing angle compared to other types of displays.

In particular for mobile devices, it is often advantageous to maximize the display area of the OLED displays on the front surface of the mobile devices. However, this leaves little room for other components on the front surface such as optical sensors (e.g. illuminance sensors, camera modules, and/or fingerprint sensors).

An OLED display device can include a pixel region and a peripheral region adjacent to the pixel region. A plurality of pixels capable of displaying images can be disposed in the pixel region of the OLED display device in a regular pattern, and a plurality of wirings can be disposed in the peripheral region.

When an optical sensor such as a camera module is disposed at the back of the OLED display device, light passes through the plurality of pixels or the plurality of wirings disposed in the OLED display to reach the optical sensor. But diffraction and interference of light by the plurality of pixels or the plurality of wirings can occur and thus, image quality acquired through the optical sensor can be deteriorated.

SUMMARY

An electronic device of an embodiment of the present disclosure may include an optical sensor, and an organic light emitting diode display panel including a first region corresponding to where the optical sensor is disposed and a second region distinct from the first region. The organic light emitting diode display panel may include first organic material arrangement regions disposed in the first region, second organic material arrangement regions disposed in the second region, first electrodes disposed on a back surface of the first organic material arrangement regions, second electrodes disposed on a back surface of the second organic material arrangement regions, and a common electrode disposed on an upper surface of the first organic material arrangement regions and the second organic material arrangement regions. An area of the first organic material arrangement regions may be larger than an area of the second organic material arrangement regions.

An organic light emitting diode display device of an embodiment of the present disclosure may include a camera, and an organic light emitting diode display panel including a first region corresponding to where the camera is disposed and a second region distinct from the first region. The organic light emitting diode display panel may include an organic layer including first organic material arrangement regions disposed in the first region and second organic material arrangement regions disposed in the second region, a first electrode layer including first electrodes disposed on a back surface of the first organic material arrangement regions and second electrodes disposed on a back surface of the second organic material arrangement regions, and a common electrode layer disposed on an upper surface of the organic layer. An area of the first organic material arrangement regions may be larger than an area of the second organic material arrangement regions.

A method for manufacturing an organic light emitting diode display panel of an embodiment of the present disclosure may include an operation of forming one or more inorganic layers in a first organic material arrangement region and a second organic material arrangement region on a substrate, an operation of forming a first anode electrode in a first area of the first organic material arrangement region, an operation of forming a second anode electrode in a second area of the second organic material arrangement region, the second organic material arrangement region being smaller than the first organic material arrangement region, an operation of forming a pixel define layer to cover an edge of the first anode electrode and an edge of the second anode electrode, an operation of forming an organic material in the first organic material arrangement region and the second organic material arrangement region, and an operation of forming a common electrode on an upper surface of the first organic material arrangement region and the second organic material arrangement region.

According to certain embodiments disclosed in the present document, clear image may be acquired through an optical sensor disposed at the back of an OLED display.

In addition, various effects directly or indirectly identified through the present document may be provided.

DETAILED DESCRIPTION

Figure 1:
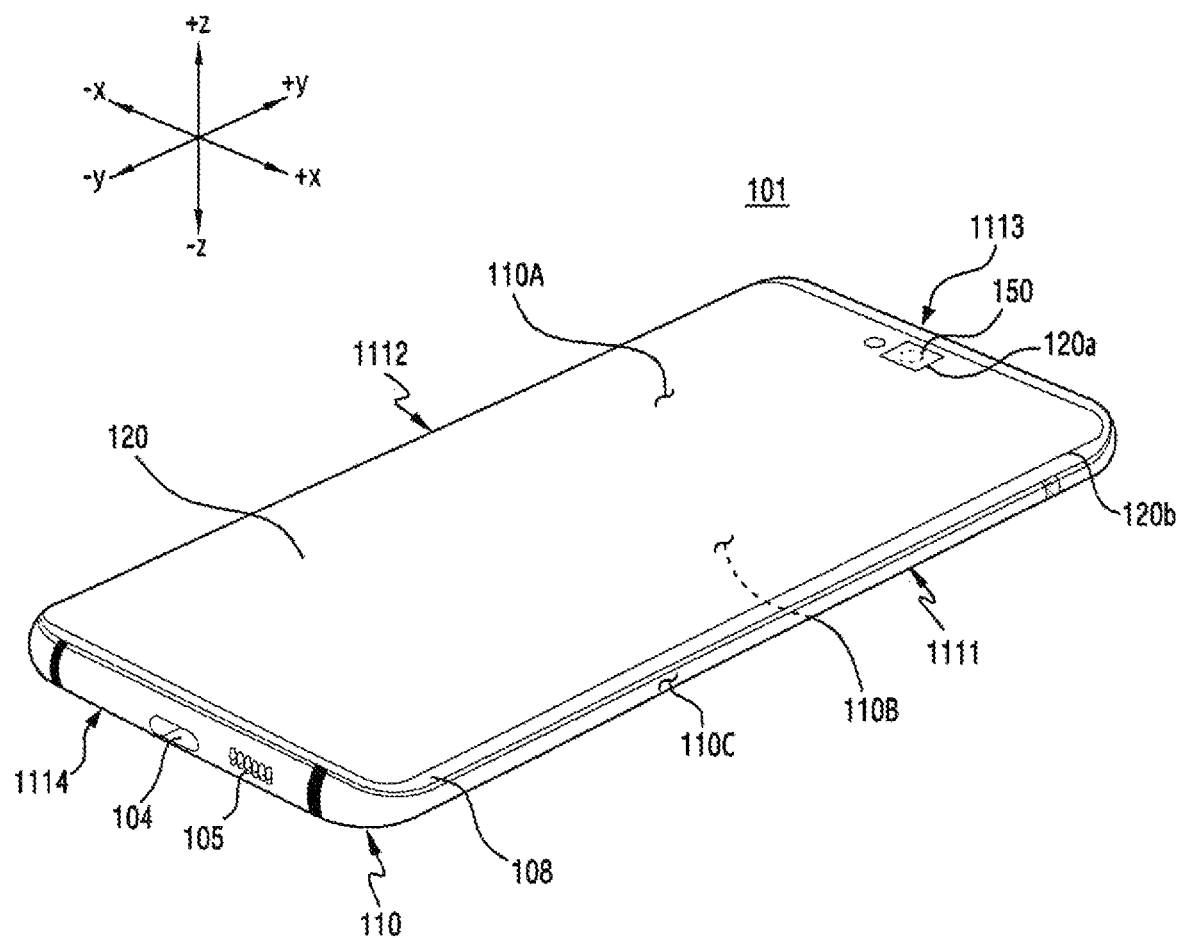
FIG. 1 is a front perspective view of an electronic device according to an embodiment.

FIG. 1 is a front perspective view of an electronic device 101 according to an embodiment.

The electronic device 101 of FIG. 1 may correspond to an electronic device 701 of FIG. 7 described later. For example, the electronic device 101 may include some or all of the components constituting the electronic device 701 of FIG. 7.

Referring to FIG. 1, the electronic device 101 of an embodiment of the present disclosure is exemplified as a bar type electronic device, but other types such as slidable, rollable or foldable types may also be applied.

In an embodiment, the electronic device 101 may include a display device. For example, the electronic device 101 may include an OLED display device.

Referring to FIG. 1, the electronic device 101 of an embodiment of the present disclosure may include a housing 110 including a first surface (or front surface) 110A, a second surface (or rear surface) 110B, and a side surface (or a side wall) 110C surrounding a space between the first surface 110A and the second surface 110B. In this or another embodiment, the housing 110 may refer to the structure forming at least a part of the first surface 110A, the second surface 110B, and the side surface 110C of FIG. 1.

According to an embodiment, the first surface 110A may be formed by a front plate 108 (e.g., glass plate or polymer plate including various coating layers) at least a portion of which is substantially transparent. In an example, the front plate 108 may include, at at least one side edge portion, a curved portion that is bent and extended seamlessly from the first surface 110A toward a rear plate (e.g. rear plate forming the rear surface 110B).

In an embodiment, the second surface 110B may be formed by a substantially opaque rear plate (not shown). The rear plate may be made by coated or tinted glass, ceramic, polymer, metal (e.g., aluminum, stainless steel (STS), or magnesium), or a combination of at least two of the above materials. In an example, the rear plate may include, at at least one side edge portion, a curved portion that is bent and extended seamlessly from the second surface 110B toward the front plate 108.

In an embodiment, the side surface 110C may be formed by a side member (or side bezel structure or side wall) that includes metal and/or polymer coupled to the front plate 108 and the rear plate (not shown). In an example, the side surface 110C may include a first side surface 1111, a second side surface 1112 that is substantially parallel to the first side surface 1111 and is extended along a first direction (e.g., +y and −y directions of FIG. 1), a third side surface 1113 that extends along a second direction (e.g., +x and −x directions of FIG. 1) substantially perpendicular to the first direction and connects one end (e.g., one end of the +y direction of FIG. 1) of the first side surface 1111 and one end (e.g., one end of the +y direction of FIG. 1) of the second side surface 1112, and/or a fourth side surface 1114 that is substantially parallel to the third side surface 1113 and connects the other end (e.g., one end of the −y direction of FIG. 1) of the first side surface 1111 and the other end (e.g., one end of the −y direction of FIG. 1) of the second side surface 1112.

In an embodiment, the electronic device 101 may include an optical sensor 150. In an example, the optical sensor 150 may be a fingerprint sensor, an illuminance sensor, and/or a camera module. In an example, the optical sensor 150 may be referred to as the camera 150, in the case where the optical sensor 150 is a camera module.

In an embodiment, the optical sensor 150 may be disposed in a region overlapping with at least one region of a display panel 120. The optical sensor 150 may be embedded to be overlapped with the display panel 120.

In an embodiment, the electronic device 101 may include the display panel 120.

In an embodiment, the display panel 120 may be exposed through a large portion of the front plate 108. In an example, the display panel 120 may be coupled to or disposed adjacent to a touch sensing circuit, a pressure sensor capable of measuring the intensity (pressure) of touches, and/or a digitizer for detecting a stylus pen outputting magnetic field. In an example, corners of the display panel 120 may be formed to be substantially the same as the outer shape (e.g., curved surface) of the adjacent front plate 108.

In an embodiment, the display panel 120 may include an organic LED (OLED) panel or an active-matrix organic LED (AMOLED) panel. As such, in an example, the display panel 120 may include an OLED display panel.

In an embodiment, the display panel 120 may include a plurality of pixels (PX). Each of the plurality of pixels (PX) may include at least one light emitting device. The display panel 120 may drive the plurality of pixels (PX) in response to image data inputted from a controller or a processor, thereby outputting images. In an embodiment, the electronic device 101 may include a touch sensor panel (TSP) disposed on the display panel 120 to control user interfaces outputted through the display panel 120. The touch sensor panel may detect a position of an object (e.g., a user's finger or a stylus pen) that is touching the display panel 120 or is hovering over the display panel 120. The touch sensor panel may be implemented by various types of touch sensing technology, such as resistive, capacitive, surface acoustic wave, and infrared rays.

In an embodiment, the display panel 120 may include a first region 120a corresponding to a region in which the optical sensor 150 is disposed and a second region 120b distinct from the first region 120a.

In an embodiment, the first region 120a of the display panel 120 may pass light from the outside of the electronic device 101 toward the optical sensor 150 or pass light outputted from the optical sensor 150 toward an external object or the external space surrounding the electronic device 101. In an example, the second region 120b of the display panel 120 may be a region other than the first region 120a among a screen display region.

In an embodiment, the display panel 120 may output various content (e.g., images, videos, texts, or icons) through the first region 120a and the second region 120b. The first region 120a and the second region 120b may include a plurality of pixels for outputting contents.

In an embodiment, the number of pixels included in the first region 120a per unit area may be less than that of the second region 120b in order to increase light transmittance for the optical sensor 150 located beneath the first region 120a. In another example, the electrodes of the pixels disposed in the first region 120a may have lower amounts of reflective material and higher amounts of transmissive material, as compared to the pixels in the second region 120b.

In an embodiment, the first region 120a may include an irregular emission region in order to mitigate diffraction and interference of light reaching the optical sensor 150 located below the first region 120a. In an example, in order for the first region 120a to include the irregular emission region, the arrangement of anode electrodes in the first region 120a may be misaligned.

In an embodiment, the electronic device 101 may include a connector hole 104 and an audio module 105.

In an embodiment, the connector hole 104 may accommodate a connector for transmitting and/or receiving power and/or data with an external electronic device (e.g., electronic devices 702 and 704 of FIG. 7) or a connector for transmitting and/or receiving audio signals with the external electronic device. For example, the connector hole 104 may be a USB connector or an earphone jack (or "earphone interface"). In an example, the USB connector and the earphone jack may be implemented as a single hole. In another embodiment, the electronic device 101 may transmit and/or receive power and/or data, or transmit and/or receive an audio signal, wirelessly with an external device without requiring a physical connector hole.

In an embodiment, the audio module 105 may include a microphone hole and a speaker hole. The microphone hole may accommodate a microphone for acquiring sound, or may accommodate a plurality of microphones so that the microphones can detect the directionality of the sound. In another example, the speaker hole and the microphone hole may be implemented as one hole. The electronic device 101 may include a speaker (e.g., piezo speaker) that does not require a physical speaker hole. The speaker hole may include an external speaker hole and a call receiver hole.

In an embodiment, the electronic device 101 may include a sensor module (not shown), thereby providing electronic signals or data values corresponding to internal operational states or external environmental states of the electronic device 101. The electronic device 101 may further include another sensor module (not shown), such as a gesture sensor, a gyro sensor, a barometric pressure sensor, a magnetic sensor, an acceleration sensor, a grip sensor, a color sensor, an infrared (IR) sensor, a temperature sensor, or a humidity sensor.

Figure 2A:
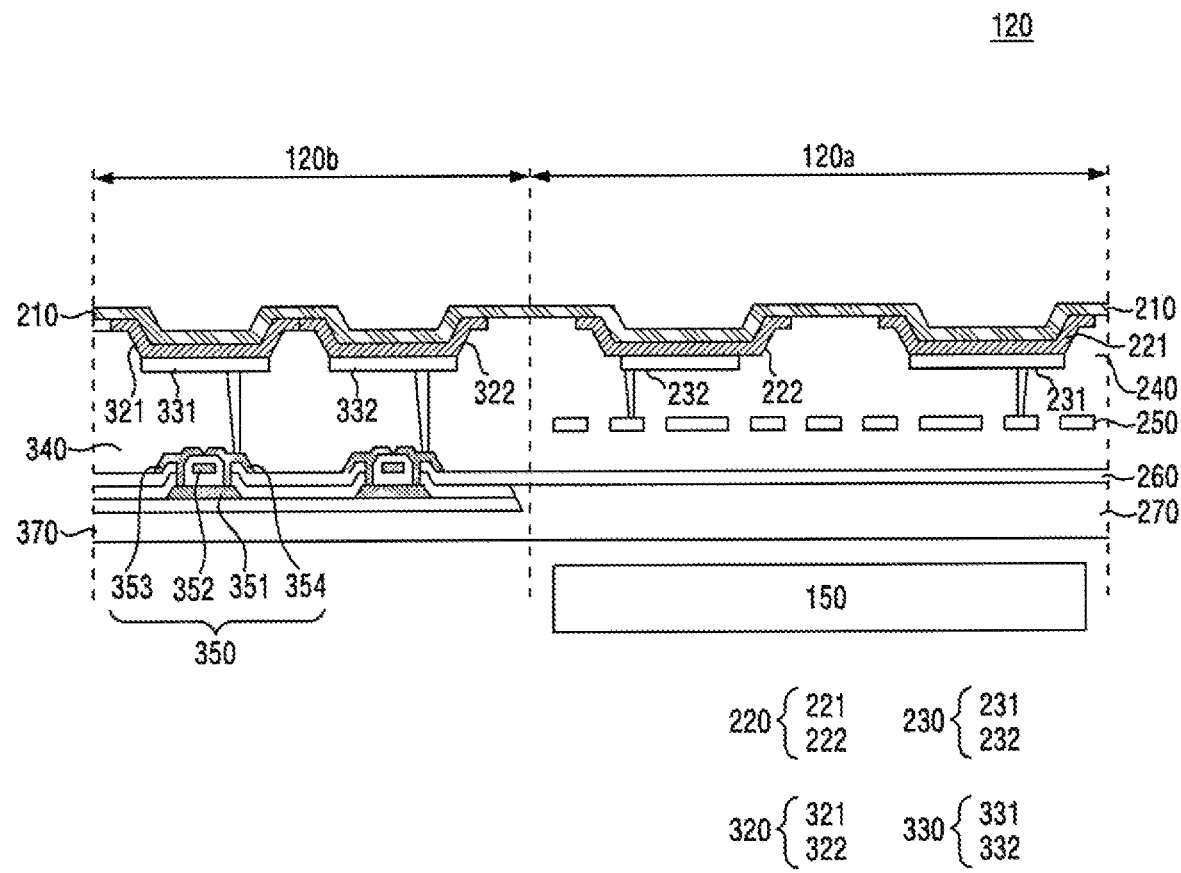
FIG. 2A illustrates a cross-sectional view of a display panel according to an embodiment.

FIG. 2A is a cross-sectional view of a display panel 120 according to an embodiment.

In an embodiment, the display panel 120 may include a first region 120a and a second region 120b.

In an embodiment, the optical sensor 150 may be disposed on the back of the first region 120a (i.e. below the first region 120a as shown in FIG. 2A).

In an embodiment, the second region 120b of the display panel 120 may be a region distinct from the first region 120a. In an example, the density of pixels disposed in the first region 120a may be lower than the density of pixels disposed in the second region 120b.

In an embodiment, the first region 120a of the display panel 120 may include a common electrode 210, a first organic material arrangement region 220, a first electrode 230, a first pixel define layer 240, a driving wiring 250, intermediate layer 260, and a first substrate 270.

In an embodiment, the second region 120b of the display panel 120 may include the common electrode 210, a second organic material arrangement region 320, a second electrode 330, a second pixel define layer 340, a switching device 350, and a second substrate 370.

In an embodiment, the display panel 120 may have an emission region. The emission region may refer to the region where light constituting a pixel of the displayed content is emitted. The emission region may include a plurality of regions emitting light of different colors. For example, a pattern emission region may have a structure separating each pixel. In this example, the pattern emission region may include a red emission region for emitting red light, a green emission region for emitting green light, and/or a blue emission region for emitting blue light.

In an embodiment, in an organic material arrangement region within the emission region, holes supplied through an anode electrode and electrons supplied through a cathode electrode may be coupled to each other to emit light. In the present document, the organic material arrangement region refers to a region in which organic material corresponding to one electrode pair (or an anode electrode) is disposed within one pixel.

In an embodiment, the first electrode 230 and the second electrode 330 may each include an anode electrode. The common electrode 210 may include a cathode electrode. The first electrode 230 may be referred to as a first anode electrode. The second electrode 330 may be referred to as a second anode electrode. The common electrode 210 may be referred to as a common electrode layer.

In an embodiment, the first organic material arrangement region 220 may be disposed between the first electrode 230 and the common electrode 210. In an embodiment, the second organic material arrangement region 320 may be disposed between the second electrode 330 and the common electrode 210.

In an embodiment, the first electrode 230 may be disposed on the back surface of the first organic material arrangement region 220.

In an embodiment, the second electrode 330 may be disposed on the back surface of the second organic material arrangement region 320.

In an embodiment, the first electrode 230 may include a transparent layer at both sides of a metal layer. The transparent layer may include indium tin oxide (ITO). The first electrode 230 may include the transparent layer, thereby increasing light transmittance for the optical sensor 150.

In an embodiment, areas and/or shapes of the pattern emission regions disposed in the first region 120a and second region 120b of the display panel 120 may be different from each other. In an embodiment, the common electrode 210 may be formed using a common mask, and may be laminated on the first organic material arrangement region 220 and the second organic material arrangement region 320 disposed in substantially the same plane. For example, since the common electrode 210 is disposed to be continuously connected or extended over the first organic material arrangement region 220 and the second organic material arrangement region 320, the common electrode 210 may be shared by the plurality of pixels in both the first organic material arrangement region 220 and the second organic material arrangement region 320.

In an embodiment, the first electrode 230 and the second electrode 330 may include the metal layer. In an embodiment, the common electrode 210 may be disposed on the upper surfaces of the first organic material arrangement region 220 and the second organic material arrangement region 320. In an example, the common electrode 210 may include a transparent or semitransparent metal material.

In an embodiment, the common electrode 210 may transmit part of light provided by the organic light emitting material disposed in the first organic material arrangement region 220, and reflect part of the light. The light reflected by the common electrode 210 may be reflected again by the first electrode 230.

In an embodiment, the first organic material arrangement region 220 and the second organic material arrangement region 320 may include a concave region and a peripheral region surrounding the concave region. The concave region may include a flat region and an inclined region.

In an embodiment, the first organic material arrangement region 220 and the second organic material arrangement region 320 are regions in which the organic material is disposed, and may include a plurality of organic material arrangement regions emitting light of different colors.

In an embodiment, the first organic material arrangement region 220 may include a plurality of organic material arrangement regions. For example, the first organic material arrangement region 220 may include the organic material arrangement region 221 for emitting red light, the organic material arrangement region 222 for emitting green light, and/or an organic material arrangement region (e.g., organic material arrangement region 223 of FIG. 4) for emitting blue light.

In an embodiment, the second organic material arrangement region 320 may include a plurality of organic material arrangement regions. For example, the second organic material arrangement region 320 may include the organic material arrangement region 321 for emitting red light, the organic material arrangement region 322 for emitting green light, and/or an organic material arrangement region (e.g., organic material arrangement region 323 of FIG. 5) for emitting blue light.

In the present document, the first organic material arrangement region 220 may refer to at least one of the organic material arrangement region 221 for emitting red light, the organic material arrangement region 222 for emitting green light, and the organic material arrangement region (e.g., the organic material arrangement region 223 of FIG. 4) for emitting blue light.

In the present document, the second organic material arrangement region 320 may refer to at least one of the organic material arrangement region 321 for emitting red light, the organic material arrangement region 322 for emitting green light, and the organic material arrangement region (e.g., the organic material arrangement region 323 of FIG. 5) for emitting blue light.

In an embodiment, the first region 120a and the second region 120b may include a plurality of pixels.

In an embodiment, each of the plurality of pixels disposed in the first region 120a may include the first organic material arrangement region 220 and the first electrode 230. In an embodiment, the first electrode 230 may be disposed on the back surface of the first organic material arrangement region 220 including the plurality of organic material arrangement regions. The first electrode 230 may refer to at least one of the electrode 231, the electrode 232, or another electrode (e.g., electrode 233 of FIG. 4).

In an embodiment, each of the plurality of pixels disposed in the second region 120b may include the second organic material arrangement region 320 and the second electrode 330. In an embodiment, the second electrode 330 may be disposed on the back surface of the second organic material arrangement region 320 including the plurality of organic material arrangement regions. The second electrode 330 may refer to at least one of the electrode 331, the electrode 332, or another electrode 333 in FIG. 5.

In an embodiment, widths and/or sizes of the first organic material arrangement region 220 and the second organic material arrangement region 320 may be different.

In an embodiment, a fine metal mask (FMM) may be used to deposit an organic material onto the first organic material arrangement region 220 and the second organic material arrangement region 320.

In an embodiment, the fine metal mask (FMM) used to deposit the organic material onto the first organic material arrangement region 220 may have a different pattern from the FMM used for depositing the organic material onto the second organic material arrangement region 320. In an example, an opening region of the FMM used to deposit the organic material onto the first organic material arrangement region 220 may be formed to correspond to the first organic material arrangement region 220. An opening region of the FMM used to deposit the organic material onto the second organic material arrangement region 320 may be formed to correspond to the second organic material arrangement region 320.

In an embodiment, the first organic material arrangement region 220 each may be disposed to be spaced apart from each other to increase light transmittance for the optical sensor 150. When the fine metal mask (FMM) is used to deposit the organic material onto the first organic material arrangement region 220, the margin between the opening regions of the FMM may be a first length.

In an embodiment, spaces between the second organic material arrangement regions 320 may overlap. When the FMM is used to deposit the organic material onto the second organic material arrangement region 320, the margin between the opening regions of the FMM may be a second length shorter than the first length. For example, portion corresponding to a margin region between the opening regions of the FMM in the first organic material arrangement region 220 may include a transmissive region in which the optical sensor 150 receives external light.

In an embodiment, the first electrode 230 of the first region 120a may be connected to the driving wiring 250. The driving wiring 250 may be made of metal such as aluminum (Al), silicon (Si), lithium (Li), calcium (Ca), or magnesium (Mg).

In an embodiment, wiring disposed in the first region 120a may be made of a material different from that of the wiring disposed in the second region 120b. For example, the wiring disposed in the first region 120a may include transparent wiring.

In an embodiment, the second electrode 330 of the second region 120b may be electrically connected to the switching element 350. The switching element 350 may include an active layer 351, a gate electrode 352, a source electrode 353, and a drain electrode 354. Although the structure in which the second electrode 330 is connected to the drain electrode 354 is illustrated in FIG. 2A to FIG. 2F, the second electrode 330 may be connected to the source electrode 353 according to an alternative design.

The way in which the plurality of pixels disposed in the first region 120a are connected to the driving wiring 250 or a driving circuit through the first electrode 230 will be described in detail with reference to FIG. 3A to FIG. 3B.

In an embodiment, holes supplied through the first electrode 230 and electrons supplied through the common electrode 210 may be combined in the first organic material arrangement region 220. In an example, by combining the holes supplied through the first electrode 230 and the electrons supplied through the common electrode 210, the organic light emitting material disposed in the first organic material arrangement region 220 may emit light having wavelength within a specified range. In an example, the first region 120a may emit light within an area of the first electrode 230.

In an embodiment, holes supplied through the second electrode 330 and electrons supplied through the common electrode 210 may be combined in the second organic material arrangement region 320. In an example, by combining the holes supplied through the second electrode 330 and the electrons supplied through the common electrode 210, the organic light emitting material disposed in the second organic material arrangement region 320 may emit light having wavelength within a specified range.

In an embodiment, the common electrode 210 may be at least partially transmissive, allowing part of light emitted from the organic light emitting material to be transmitted toward the outside of the electronic device and reflect part of the light toward the first electrode 230 and/or the second electrode 330.

In an embodiment, the first pixel define layer 240 may distinguish each of the first organic material arrangement regions 220. The second pixel define layer 340 may distinguish each of the second organic material arrangement regions 320.

In an embodiment, the first region 120a may include the first pixel define layer 240 disposed on side surfaces of the first electrode 230 and the first organic material arrangement region 220. For example, the organic material arrangement region 221 for emitting red light and the organic material arrangement region 222 for emitting green light may not overlap each other, due to the presence of the first pixel define layer 240. The first pixel define layer 240 may be disposed between the organic material arrangement region 221 for emitting red light and the organic material arrangement region 222 for emitting green light, and be disposed on the side surface of the first electrode 230.

In an embodiment, the second region 120b may include the second pixel define layer 340 disposed on side surfaces of the second electrode 330 and the second organic material arrangement region 320. In an example, at least one region of the organic material arrangement region 321 for emitting red light and the organic material arrangement region 322 for emitting green light may be overlapped. To prevent color mixing, the second pixel define layer 340 may be disposed between the organic material arrangement region 321 for emitting red light and the organic material arrangement region 322 for emitting green light.

In an embodiment, the first substrate 270 and the second substrate 370 may support and protect various constituent elements of the display panel 120. The first substrate 270 and the second substrate 370 may be separate components that are disposed with respect to the first region 120a and the second region 120b, respectively, or may be an integrated component. The first substrate 270 and the second substrate 370 may be made of an insulating material. For example, the first substrate 270 and the second substrate 370 may be made of a transparent glass material (where the main component is $SiO_2$), but is not limited thereto, and may be made of a transparent or semitransparent polymer. For example, the polymer may be polyethersulfone (PES), polyimide (PI), polyethylene terephthalate (PET), polyethylene naphthalate (PEN), polycarbonate (PC)-based insulating organic material. In an example, at least one or more inorganic layers and organic layers may be disposed on upper surfaces of the first substrate 270 and the second substrate 370.

Figure 2B:
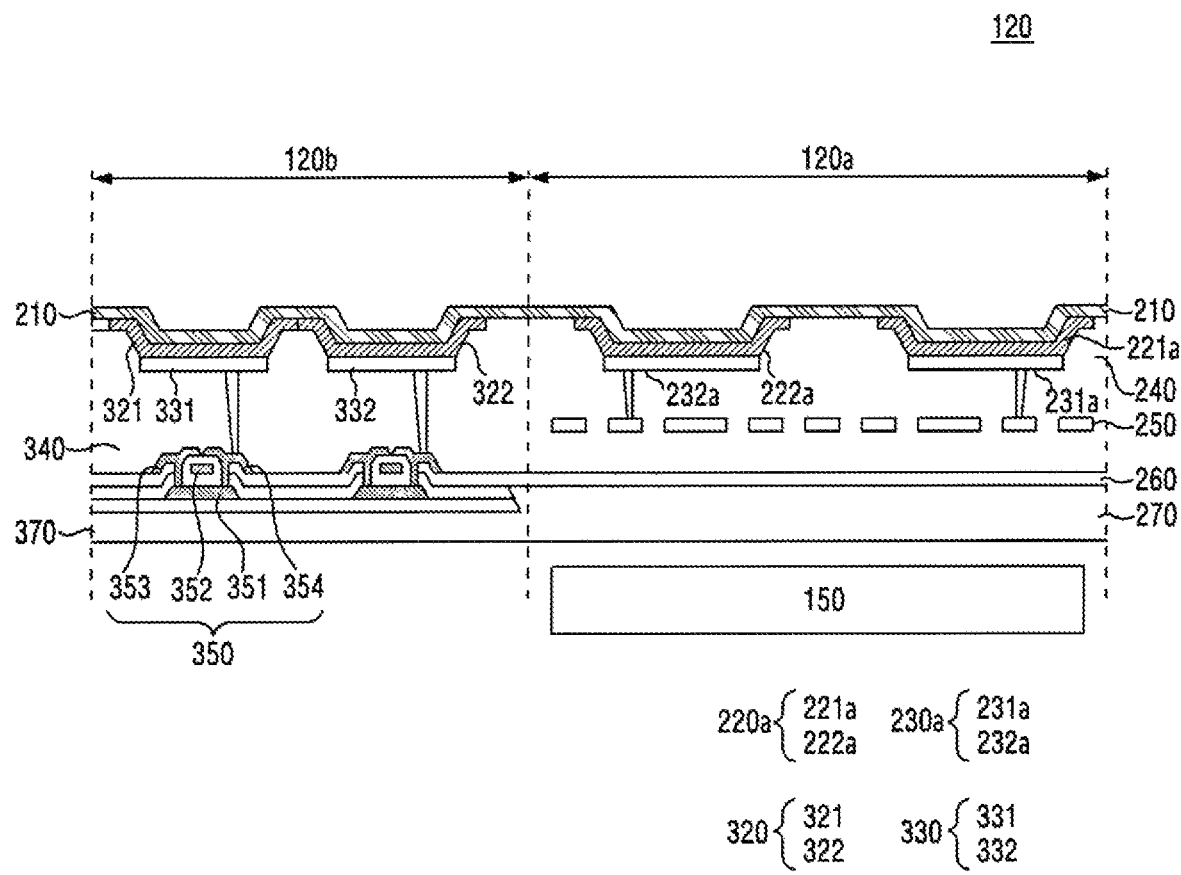
FIG. 2B illustrates a cross-sectional view of a display panel according to another embodiment.
Figure 2C:
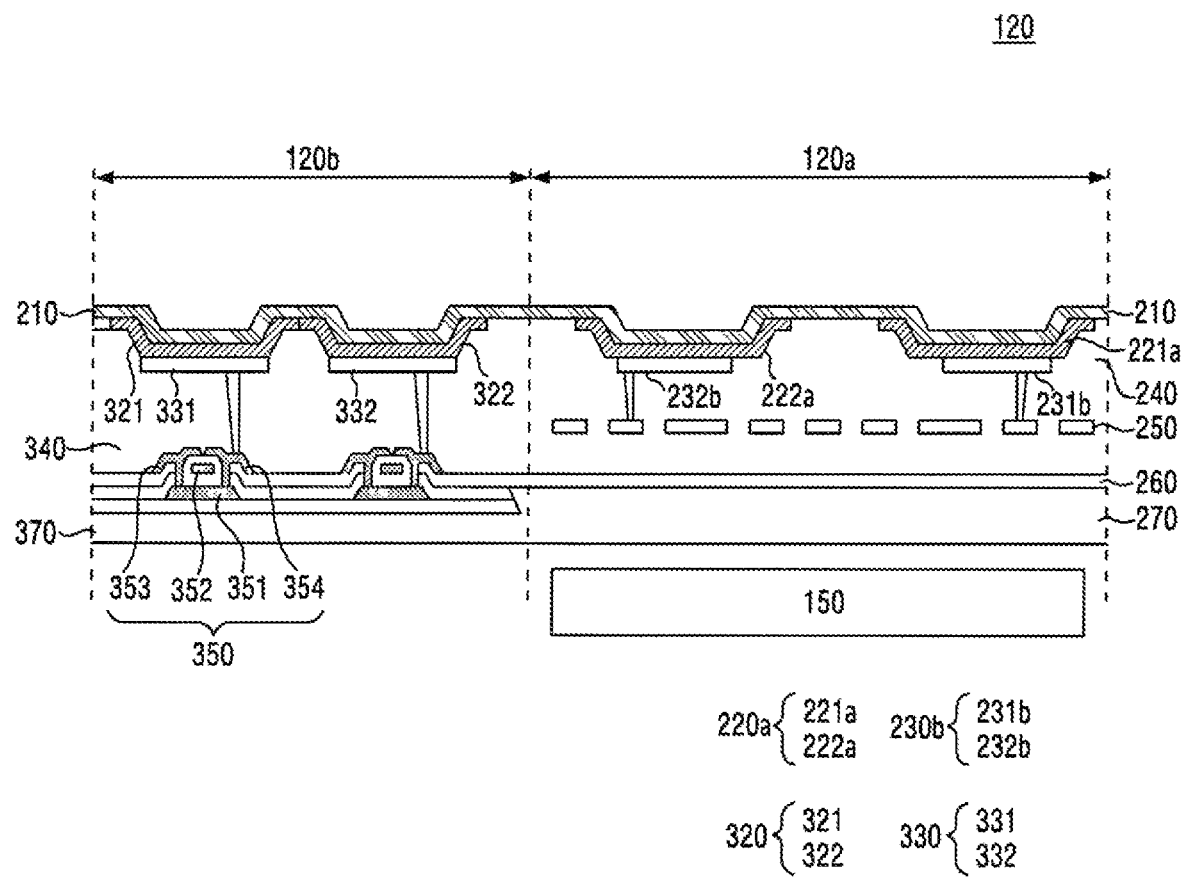
FIG. 2C illustrates a cross-sectional view of a display panel according to further embodiment.
Figure 2D:
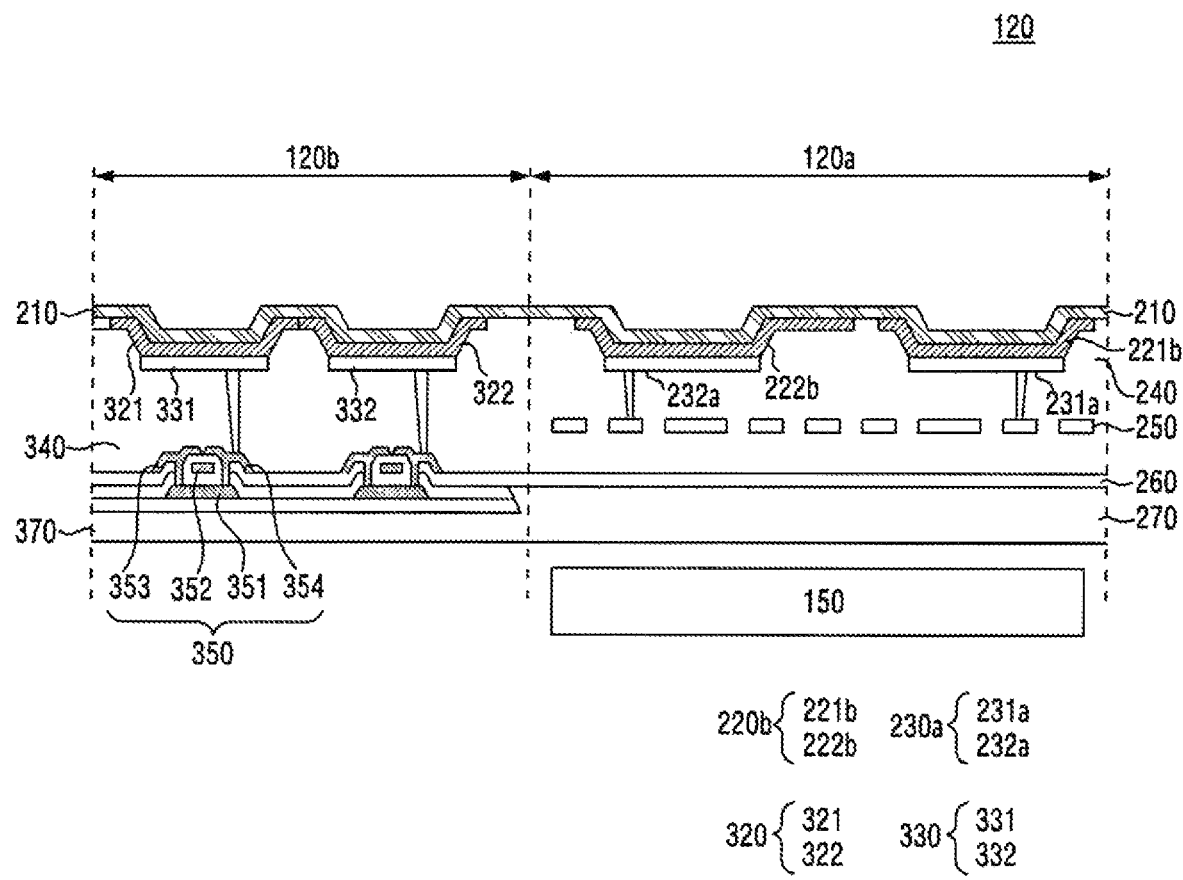
FIG. 2D illustrates a cross-sectional view of a display panel according to yet another embodiment.
Figure 2E:
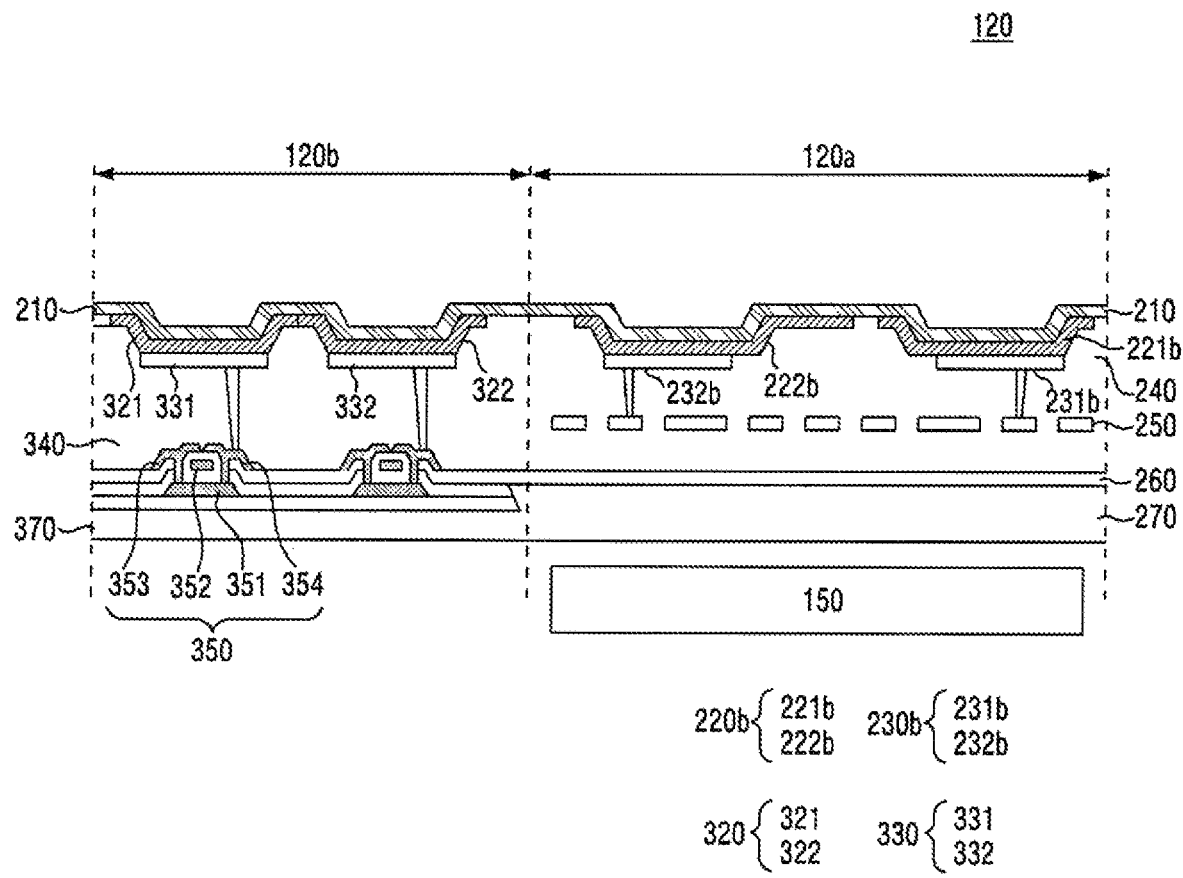
FIG. 2E illustrates a cross-sectional view of a display panel according to still another embodiment.
Figure 2F:
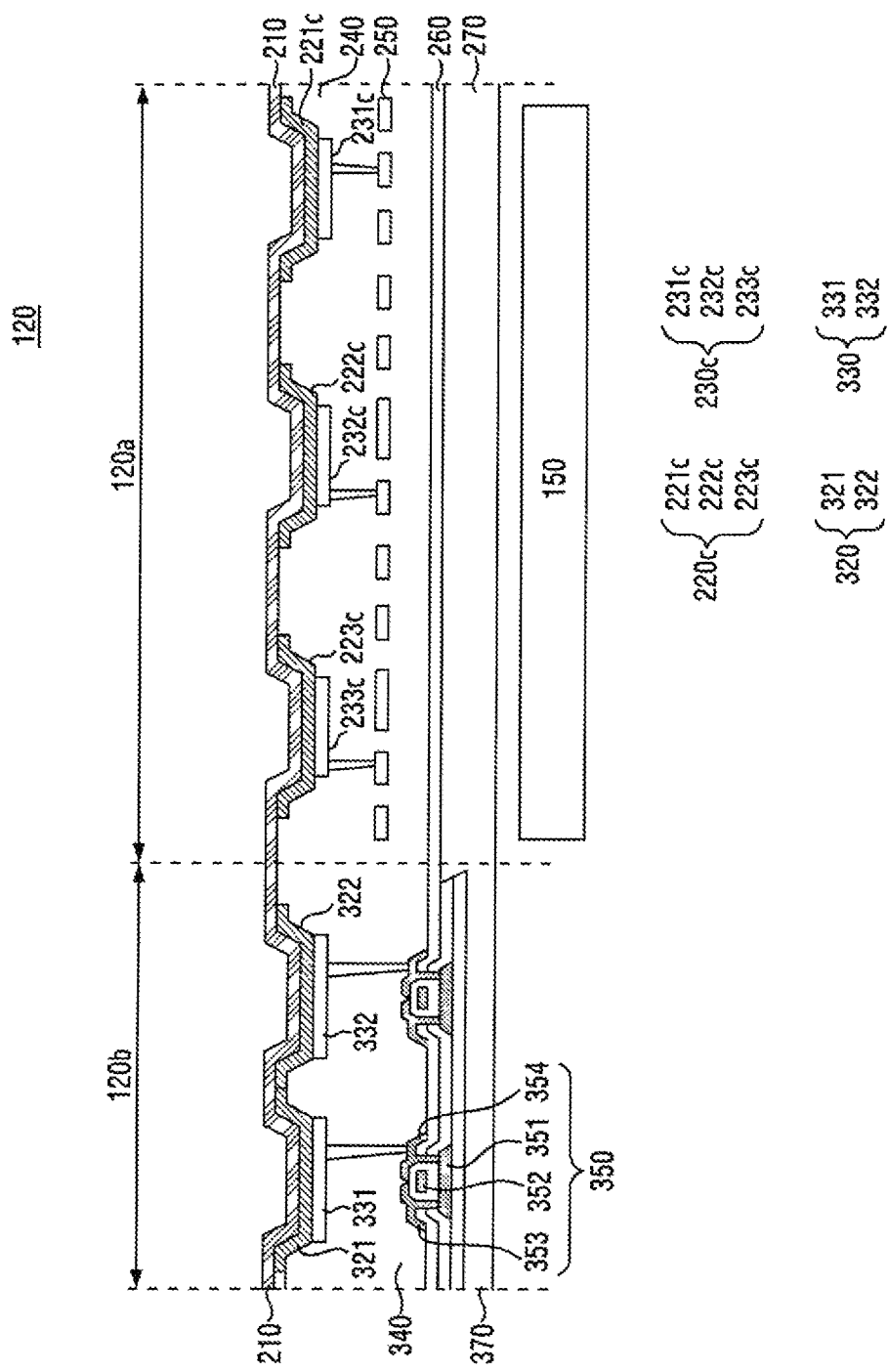
FIG. 2F illustrates a cross-sectional view of a display panel according to still another embodiment.

FIG. 2B illustrates a cross-sectional view of a display panel 120 according to another embodiment. FIG. 2C illustrates a cross-sectional view of a display panel according to a further embodiment. FIG. 2D illustrates a cross-sectional view of a display panel according to a yet another embodiment. FIG. 2E illustrates a cross-sectional view of a display panel according to a still another embodiment. FIG. 2F illustrates a cross-sectional view of a display panel according to a still another embodiment.

Referring to FIG. 2B to FIG. 2F, widths and/or sizes of the first organic material arrangement region 220 and the second organic material arrangement region 320 may have various designs. In an example, the opening region of the fine metal mask (FMM) used to deposit an organic material onto the first organic material arrangement region 220 may have various shapes and sizes.

In an embodiment, the first organic material arrangement region 220 may be implemented as the first organic material arrangement region 220a (that includes 221a and 222a), the first organic material arrangement region 220b (that includes 221b and 222b), and/or the first organic material arrangement region 220c.

In an embodiment, the first organic material arrangement region 220 may include a concave region and a peripheral region surrounding the concave region. The concave region may include a flat region and an inclined region.

Referring to FIG. 2B and FIG. 2C, the first organic material arrangement region 220a may be an organic material arrangement region in which the peripheral region is symmetric with respect to the concave region.

Referring to FIG. 2D to FIG. 2E, the first organic material arrangement region 220b may be an organic material arrangement region in which the peripheral region is asymmetric with respect to the concave region.

Referring to FIG. 2F, the first organic material arrangement region 220c may be an organic material arrangement region having the substantially same area and/or shape as the second organic material arrangement region 320. For example, the area of a flat region of the first organic material arrangement region 220c may be substantially the same as the area of a flat region of the second organic material arrangement region 320.

Referring to FIG. 2B to FIG. 2E, areas of the first organic material arrangement region 220a and the first organic material arrangement region 220b may be larger than an area of the second organic material arrangement region 320.

In an embodiment, a plurality of pixels disposed in the first region 120a may include a first electrode 230. In an example, the first electrode 230 may be disposed in at least one region corresponding to the back surface of the first organic material arrangement region 220. In an example, the first electrode 230 may be disposed in a region corresponding to the flat region and/or the inclined region at the back surface of the first organic material arrangement region 220. The first electrode 230 may have various shapes and sizes.

In an embodiment, the first electrode 230 may be implemented as the first electrode 230a that includes 231a and 232a), the first electrode 230b (that includes 231b and 232b), and/or the first electrode 230c.

In an embodiment, the first electrode 230a may be an electrode which is disposed in a region corresponding to the center of the flat region of the first organic material arrangement region 220a or the first organic material arrangement region 220b.

In an embodiment, the first electrode 230b may be an electrode which is disposed to be biased in a direction with respect to the center of the flat region of the first organic material arrangement region 220a or the first organic material arrangement region 220b.

In an embodiment, the first electrode 230c may be an electrode having a smaller area than the second electrode 330 disposed on the back surface of the second organic material arrangement region 320.

Referring to FIG. 2B to FIG. 2E, the areas of the first organic material arrangement region 220a and the first organic material arrangement region 220b may be larger than the area of the second organic material arrangement region 320. In this case, areas of the first electrode 230a and the first electrode 230b may be equal to or greater than the area of the second electrode 330.

Referring to FIG. 2B and FIG. 2C, the first organic material arrangement region 220a and the second organic material arrangement region 320 may be arranged in a regular or aligned state. In an example, in the regular or aligned state, the peripheral regions of the plurality of organic material arrangement regions may be symmetric with respect to their respective concave regions in the organic material arrangement regions.

Referring to FIG. 2B and FIG. 2D, the first electrode 230a may be disposed in the regular or aligned state on the back surface of the first organic material arrangement region 220a or the first organic material arrangement region 220b. In another example, in the regular or aligned state, the first electrode 230a may be disposed in a region corresponding to the center of the back surface of the first organic material arrangement region 220a and the first organic material arrangement region 220b.

Referring to FIG. 2C and FIG. 2E, the first electrode 230b may be disposed in an irregular or misaligned state on the back surface of the first organic material arrangement region 220a or the first organic material arrangement region 220b. In an example, in the irregular or misaligned state, the first electrode 230b may be disposed to be biased in a direction with respect to the center of the back surface of the first organic material arrangement region 220a and the first organic material arrangement region 220b.

Referring to FIG. 2F, the area of the first organic material arrangement region 220c (that includes 221c, 222c, and 223c) may be substantially the same as the area of the second organic material arrangement region 320. In this case, the first electrode 230c (that includes 231c, 232c, and 233c) disposed on the back surface of the first organic material arrangement region 220c may be smaller than an area of the second electrode 330 disposed on the back surface of the second organic material arrangement region 320. In an example, the size of the first electrode 230c disposed on the back surface of the first organic material arrangement region 220c may be smaller than the size of the second electrode 330, thereby allowing more free design with respect to an arrangement of the first electrode 230c when the first electrode 230c is disposed on the back surface of the first organic material arrangement region 220c.

In an embodiment, the first electrode 230c disposed on the back surface of the first organic material arrangement region 220c may be disposed in a region corresponding to the center of the back surface of the first organic material arrangement region 220c, or may be disposed in a region biased in a direction with respect to the center.

Referring to FIG. 2B to FIG. 2F, for high resolution, the second region 120b may include a large number of the second electrode 330 and tightly pack the second electrode 330 in the second organic material arrangement region 320. In an example, the second electrode 330 may be disposed on the back surface of the second organic material arrangement region 320. The second electrode 330 may be disposed such that the shape of the second electrode 330 is symmetrical with respect to a straight line passing through the center of the second organic material arrangement region 320. In another example, the second electrode 330 disposed in the second region 120b may be disposed such that the center of the region where the second electrode 330 is disposed corresponds to the center of the second organic material arrangement region 320. In an embodiment, the center of the region may mean the gravitational center of a surface formed by the region, but is not limited thereto.

In an embodiment, the second electrode 330 is regularly disposed within the second organic material arrangement region 320, such that the second electrode 330 may be aligned within the second organic material arrangement region 320.

Referring to FIG. 2B to FIG. 2F, to minimize diffraction and interference of light reaching the optical sensor 150, the first region 120a may irregularly dispose the first organic material arrangement region 220 and the first electrode 230.

Referring to FIG. 2C, although the first organic material arrangement region 220a is regularly disposed in the first region 120a, the first electrode 230b disposed in the region corresponding to the back surface of the first organic material arrangement region 220a may be irregularly disposed, such that the first electrode 230b may be misaligned with respect to the first organic material arrangement region 220a.

Referring to FIG. 2E, the first organic material arrangement region 220b may be disposed irregularly within the first region 120a, and the first electrode 230b disposed in the region corresponding to the back surface of the first organic material arrangement region 220b may also be disposed irregularly.

Referring to FIG. 2B to FIG. 2E, the areas of the first organic material arrangement region 220a and the first organic material arrangement region 220b may be larger than the area of the second organic material arrangement region 320, such that the first electrode 230a or the first electrode 230b disposed in the region corresponding to the back surface of the first organic material arrangement region 220a or the first organic material arrangement region 220b may be disposed irregularly within a wider range.

In an embodiment, when the areas of the first organic material arrangement region 220a and the first organic material arrangement region 220b are larger than the area of the second organic material arrangement region 320, the areas of the first electrode 230a and the first electrode 230b may be equal to or greater than the area of the second electrode 330.

Figure 3A:
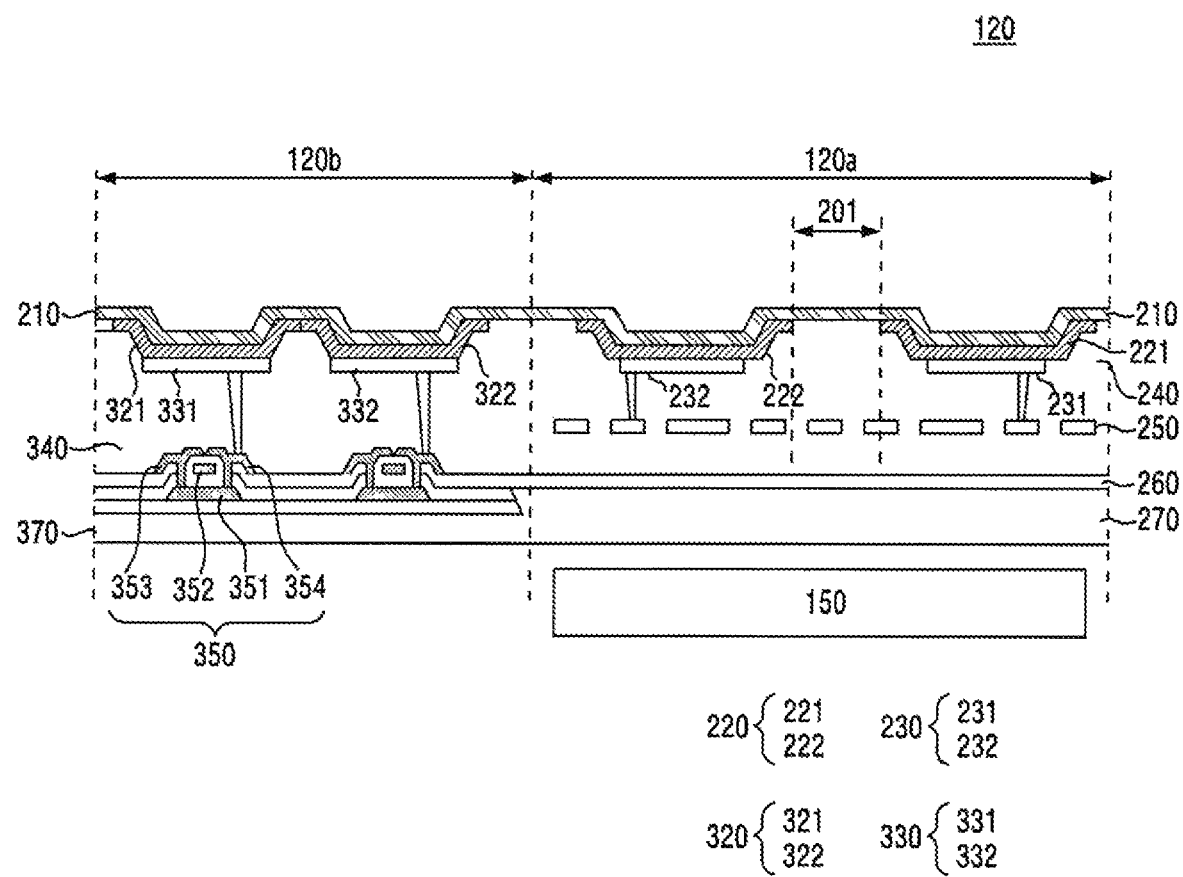
FIG. 3A illustrates a connection relationship between a driving circuit and a plurality of pixels of a display panel according to an embodiment.

FIG. 3A illustrates a connection relationship between a driving circuit and a plurality of pixels of a display panel 120 according to an embodiment.

In an embodiment, to improve light transmittance for an optical sensor 150, first organic material arrangement regions 220 may be disposed to be spaced apart from each other. In an example, the first organic material arrangement regions 220 may be disposed to be spaced apart by a first length 201 from each other. That is, the first length 201 may correspond to the length between the first organic material arrangement regions 220. In an example, the density of the plurality of pixels disposed in the first region 120a may be lower than the density of the plurality of pixels disposed in the second region 120b.

In an embodiment, the plurality of pixels disposed in the first region 120a may be driven by connecting the first electrode 230 included in each of the plurality of pixels to the driving wiring 250.

In an embodiment, the first electrode 230 may be connected to the driving wiring 250 to drive the plurality of pixels included in the first region 120a. The plurality of pixels included in the first region 120a may be connected to a switching element 350 disposed in the second region 120b through the driving wiring 250 connected to the first electrode 230.

In an embodiment, since the plurality of pixels disposed in the first region 120a are connected to the switching element 350 through the driving wiring 250 connected to the first electrode 230, the plurality of pixels may output the same data as the plurality of pixels disposed in the second region 120b.

In another embodiment, a separate driving circuit may be disposed in at least a portion of the first region 120a. The plurality of pixels included in the first region 120a may be connected to the separate driving circuit (e.g., switching device) (not shown) disposed in the first region 120a through the driving wiring 250 connected to the first electrode 230. In this case, the plurality of pixels included in the first region 120a may output data different from data outputted through the plurality of pixels disposed in the second region 120b. In an example, the plurality of pixels included in the first region 120a may be connected to the separate driving circuit included in the first region 120a. The number of the plurality of pixels included in the first region 120a may be greater than the number of separate driving circuits included in the first region 120a.

In an embodiment, the plurality of pixels disposed in the second region 120b may be driven by connecting the second electrode 330 connected to each of the plurality of pixels with the switching element 350. In an example, the number of the plurality of pixels may correspond to the number of the switching elements 350.

Figure 3B:
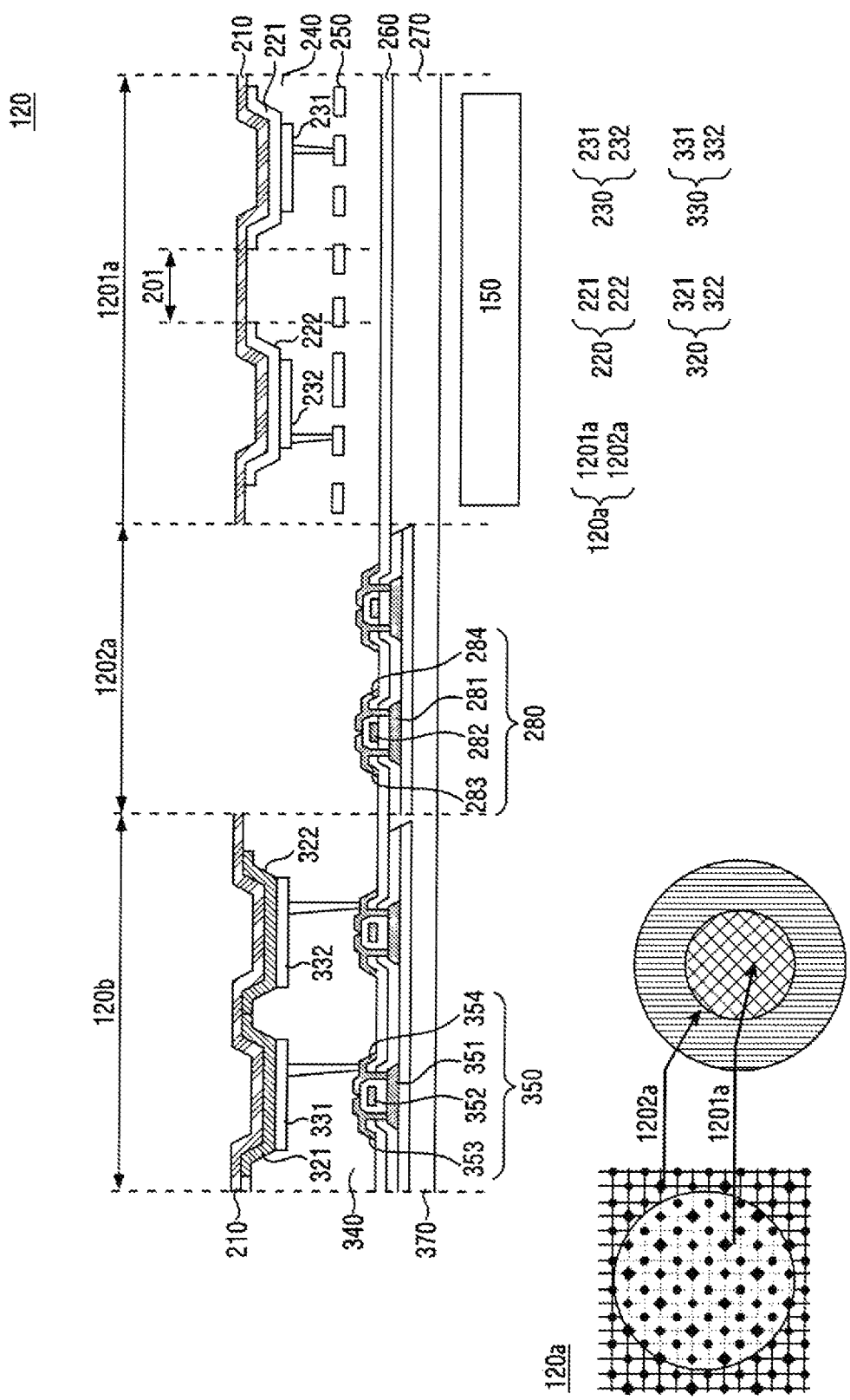
FIG. 3B illustrates a connection relationship between a driving circuit and a plurality of pixels of a display panel according to another embodiment.

FIG. 3B illustrates a connection relationship between a driving circuit and a plurality of pixels of a display panel 120 according to another embodiment.

In an embodiment, the optical sensor 150 may be disposed at the back of a first region 120a.

In an embodiment, the first region 120a may include a transmissive region 1201a and a non-transmissive region 1202a. In an example, the transmissive region 1201a may be a region corresponding to the angle of view of the optical sensor 150. The non-transmissive region 1202a may be a region beyond the angle of view of the optical sensor 150.

In an embodiment, a plurality of pixels for increasing transmittance may be included in the transmissive region 1201a of the first region 120a. A driving circuit 280 for driving the plurality of pixels included in the transmissive region 1201a may be disposed in the non-transmissive region 1202a of the first region 120a. The driving circuit 280 disposed in the non-transmissive region 1202a may be the same device as the switching device 350 disposed in the second region 120b.

In an embodiment, the driving circuit 280 may include an active layer 281, a gate electrode 282, a source electrode 283, and a drain electrode 284. In an example, driving wiring 250 of the transmissive region 1201a may be connected to the drain electrode 284 or source electrode 283 of the driving circuit 280 of the non-transmissive region 1202a.

In an embodiment, in order to improve light transmittance for the optical sensor 150, first organic material arrangement regions 220 may be disposed to be spaced apart from each other. In an example, the first organic material arrangement regions 220 may be disposed to be spaced apart by the first length 201. The first length 201 may correspond to the length between the first organic material arrangement regions 220.

In an example, the second organic material arrangement regions 320 may be disposed to be spaced apart by a second length shorter than the first length 201. Or, the second organic material arrangement regions 320 may be disposed without a mutual spaced space. In this case, the density of the plurality of pixels disposed in the transmissive region 1201a may be lower than the density of the plurality of pixels disposed in the second region 120b.

In an embodiment, the plurality of pixels disposed in the transmissive region 1201a may be connected to the driving circuit 280 disposed in the non-transmissive region 1202a through the driving wiring 250 connected to the first electrode 230. The pixels disposed in the transmissive region 1201a may be driven by being connected to the driving circuit 280 disposed in the non-transmissive region 1202a. In this case, the plurality of pixels disposed in the first region 120a may output content different from data outputted through the plurality of pixels disposed in the second region 120b.

In an embodiment, the number of the plurality of pixels disposed in the transmissive region 1201a may be equal to or greater than the number of the driving circuits 280 disposed in the non-transmissive region 1202a.

In an embodiment, pixels may not be disposed in the non-transmissive region 1202a of the first region 120a.

In another example, pixels may be included in the non-transmissive region 1202a of the first region 120a. When the plurality of pixels are disposed in the non-transmissive region 1202a of the first region 120a, the plurality of pixels disposed in the non-transmissive region 1202a may be connected to the driving circuit 280. In an example, the number of the plurality of pixels disposed in the non-transmissive region 1202a may be equal to or greater than the number of the driving circuits 280 disposed in the non-transmissive region 1202a. When the plurality of pixels are disposed in the non-transmissive region 1202a, the plurality of pixels disposed in the non-transmissive region 1202a may include the first organic material arrangement region 220 and the first electrode 230 having various shapes and sizes as shown in FIG. 2B to FIG. 2F.

In an embodiment, when the density of the plurality of pixels of the non-transmissive region 1202a is lower than the density of the plurality of pixels disposed in the second region 120b, the area of the first organic material arrangement region included by the plurality of pixels disposed in the non-transmissive region 1202a and the area of the first electrode 230 may be larger than the area of the second organic material arrangement region 320 disposed in the second region 120b and the area of the second electrode 330.

In another embodiment, when the density of the plurality of pixels of the non-transmissive region 1202a is substantially the same as the density of the pixels disposed in the second region 120b, the area of the first organic material arrangement region included by the plurality of pixels disposed in the non-transmissive region 1202a and the area of the first electrode 230 may be substantially the same as the area of the second organic material arrangement region 320 disposed in the second region 120b and the area of the second electrode 330.

In an embodiment, when the plurality of pixels disposed in the first region 120a are driven by the driving circuit 280 disposed in the non-transmissive region 1202a of the first region 120a, separate content distinct from the content outputted by the plurality of pixels disposed in the second region 120b may be outputted through the plurality of pixels disposed in the first region 120a.

Figure 4:
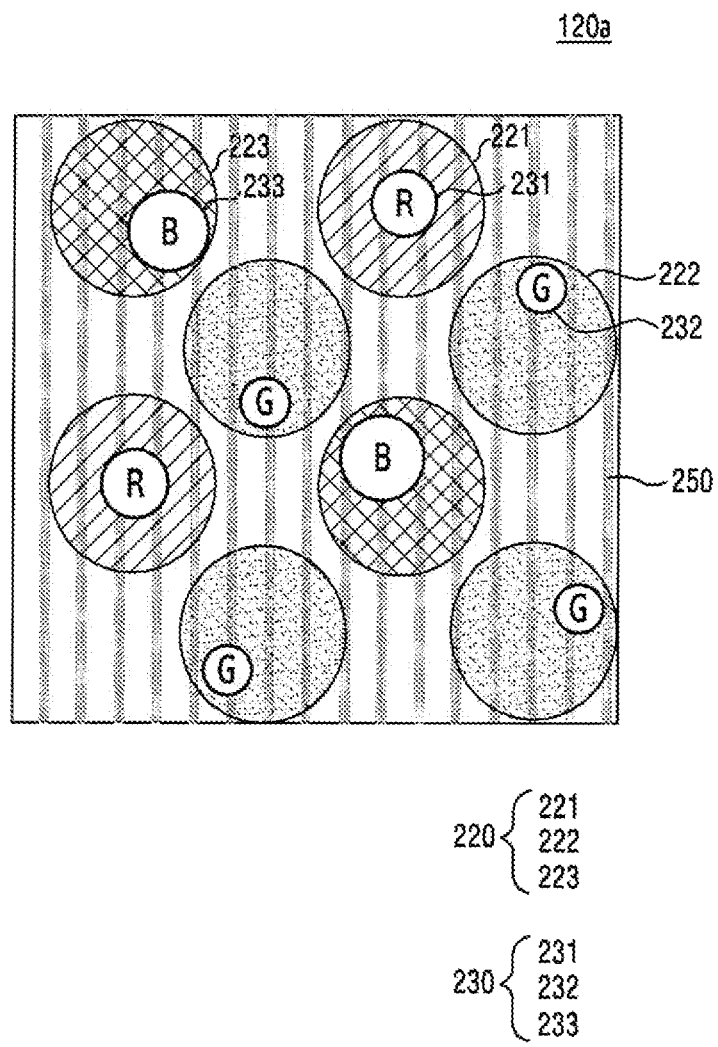
FIG. 4 illustrates a first region of a display panel according to an embodiment.

FIG. 4 illustrates a first region 120a of a display panel 120 according to an embodiment.

In an embodiment, the optical sensor 150 may be disposed at the back of the first region 120a.

In an embodiment, the first region 120a may include a first organic material arrangement region 220, a first electrode 230, a common electrode (e.g., the common electrode 210 of FIG. 2A to FIG. 2F), and a driving wiring 250.

In an embodiment, each of the plurality of pixels disposed in the first region 120a may include the first organic material arrangement region 220 and the first electrode 230.

In an embodiment, in the first region 120a of the display panel 120, an emission region may correspond to an arrangement state of the first electrode 230. The emission region of the first region 120a may be irregular, as shown.

In an embodiment, the first region 120a of the display panel 120 may include the first organic material arrangement region 220. In an example, the first organic material arrangement region 220 is the region where an organic material is disposed, and may include a plurality of organic material arrangement regions that emit light of various colors.

In an embodiment, using a fine metal mask (FMM), the first organic material arrangement region 220 may include a region onto which an organic material is deposited. In an example, an organic light emitting material may pass through an opening region of the FMM and be deposited onto the first organic material arrangement region 220. The opening region of the FMM may correspond to the first organic material arrangement region 220.

In an embodiment, the first organic material arrangement region 220 may include various shapes. Although the first organic material arrangement region 220 is shown in circular shapes in FIG. 4, it is not limited thereto and may be formed in various shapes such as quadrangles, ellipses, trapezoids, etc.

In an embodiment, the first organic material arrangement region 220 may emit different colored light using the organic light emitting material disposed thereon.

In an embodiment, the first organic material arrangement region 220 may include an organic material arrangement region 221 for emitting red light, an organic material arrangement region 222 for emitting green light, and an organic material arrangement region 223 for emitting blue light.

In an embodiment, sizes of the organic material arrangement region 221 for emitting red light, the organic material arrangement region 222 for emitting green light, and the organic material arrangement region 223 for emitting blue light may be substantially the same.

In an embodiment, the first organic material arrangement region 220 may be disposed at regular intervals as shown, but is not limited thereto, and may be disposed irregularly.

In an embodiment, the first electrode 230 may be disposed on the back surface of the first organic material arrangement region 220. In an example, the first electrode 230 may include an anode electrode.

In an embodiment, the first electrode 230 may be disposed in at least one region of the back surface of the first organic material arrangement region 220.

In an embodiment, the area of the first electrode 230 may be smaller than the area of the first organic material arrangement region 220.

In an embodiment, the arrangement region of the first electrode 230 may be varied according to the organic light emitting material disposed in the first organic material arrangement region 220. For example, a red electrode 231 for the organic material arrangement region 221 for emitting red light may be disposed in a position that corresponds to the center of the organic material arrangement region 221. A green electrode 232 for the organic material arrangement region 222 for emitting green light may be disposed in a region corresponding to a position that is spaced apart from the center of the organic material arrangement region 222 by a first distance. A blue electrode 233 for the organic material arrangement region 223 for emitting blue light may be disposed in a region corresponding to a position that is spaced apart from the center of the organic material arrangement region 223 by a second distance different from the first distance.

In an embodiment, the area of the first electrode 230 may be varied according to the organic light emitting material disposed in the first organic material arrangement region 220. For example, the area of the red electrode 231 and the area of the blue electrode 233 may be larger than the area of the green electrode 232. At the same energy intensity, green may be recognized as brighter than red and blue. Therefore, to provide excellent luminance and color temperature, and because the plurality of first organic material arrangement regions 220 have the same area regardless of the emission color, the pattern emission region may be adjusted by adjusting the area of the first electrode 230. The area of the first electrode 230 is not limited to the area shown in FIG. 4. The area of the first electrode 230 may be designed variously according to the desired luminance, color temperature, and operational lifetime of the display, etc., as long as the area of the green electrode 232 is smaller than the area of the red electrode 231 and the area of the blue electrode 233, in one embodiment.

In an embodiment, the region in which the first electrode 230 is disposed on the back surface of the first organic material arrangement region 220 may be asymmetrical with respect to a straight line passing through the center of the first organic material arrangement region 220. In an example, as such, the first electrode 230 disposed on the back surface of the first organic material arrangement region 220 may be characterized as being misaligned. In an example, the area of the first organic material arrangement region 220 may vary for each sub-pixel. For example, the area of the organic material arrangement region 223 for emitting blue light may be larger than the area of the organic material arrangement region 222 for emitting green light.

Figure 5:
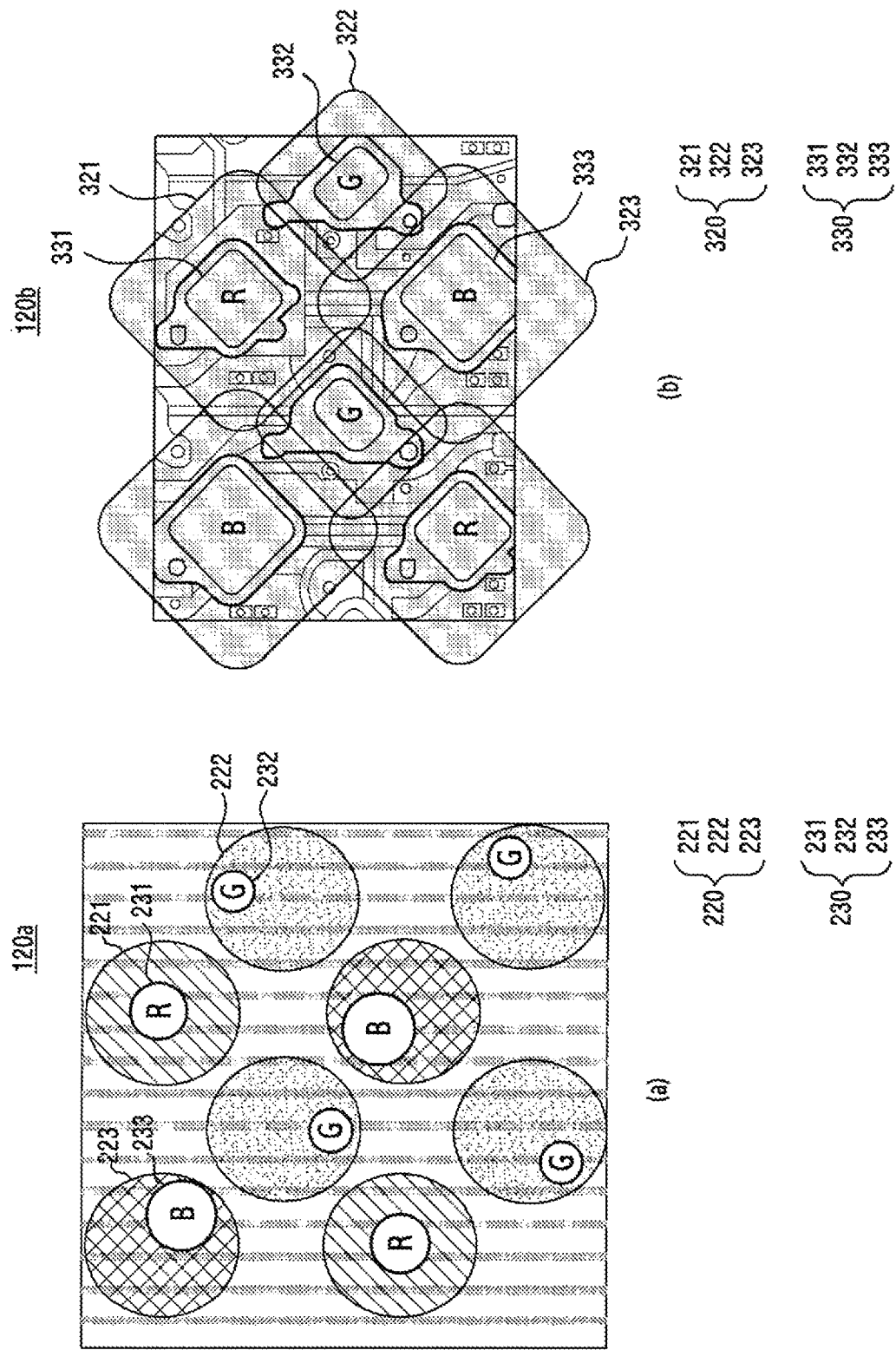
FIG. 5 illustrates a first region, and a second region, of a display panel according to an embodiment.

FIG. 5 illustrates a first region 120a, and a second region 120b, of the display panel 120 according to an embodiment.

FIG. 5(a) shows the first region 120a of the display panel 120.

Since the first region 120a shown in FIG. 5(a) is the same as the first region 120a shown in FIG. 4, duplicative description thereof will be omitted.

FIG. 5(b) shows the second region 120b of the display panel 120.

In an embodiment, the second region 120b of the display panel 120 may include a second organic material arrangement region 320 and a second electrode 330 disposed on the back surface of the second organic material arrangement region 320.

In an embodiment, the second organic material arrangement region 320 may include an organic material arrangement region 321 for emitting red light, an organic material arrangement region 322 for emitting green light, and an organic material arrangement region 323 for emitting blue light. In an example, the second organic material arrangement region 320 may be regularly disposed (i.e. disposed at regular intervals).

In an embodiment, the second electrode 330 may include an electrode 331, an electrode 332, and/or an electrode 333. The second electrode 330 is not limited thereto, and may be disposed to correspond to the number of the second organic material arrangement regions 320. In an example, the electrode 331 may be disposed on the back surface of the organic material arrangement region 321 for emitting red light. The electrode 332 may be disposed on the back surface of the organic material arrangement region 322 for emitting green light. The electrode 333 may be disposed on the back surface of the arrangement region 323 for emitting blue light.

In an embodiment, a space between first organic material arrangement regions 220 may be a region in which the first organic material arrangement regions 220 do not overlap each other. For example, the organic material arrangement region 221 for emitting red light and the organic material arrangement region 222 for emitting green light may be disposed not to overlap each other. The size of the region in which the first organic material arrangement regions 220 do not overlap each other may correspond to the size of a first pixel define layer (PDL) 240. For example, the size of the region in which the first organic material arrangement regions 220 do not overlap each other may be about 20 μm to 25 μm.

In an embodiment, at least one region of the organic material arrangement region 321 for emitting red light may overlap with the organic material arrangement region 322 for emitting green light. In an embodiment, at least one region of the organic material arrangement region 322 for emitting green light may overlap with the organic material arrangement region 323 for emitting blue light.

In an embodiment, a second pixel define layer (e.g., the second pixel define layer 340 of FIG. 2) is disposed between the second organic material arrangement regions 320, such that colored lights emitted from the second organic material arrangement regions 320 may be prevented from being mixed.

In an embodiment, the second electrode 330 may be disposed in at least one region of the back surface of the second organic material arrangement region 320. In an example, the second electrode 330 may be disposed left/right symmetrically or up/down symmetrically with respect to a straight line passing through the center of the second organic material arrangement region 320. In an example, the second electrode 330 may be disposed in a region of the back surface of the second organic material arrangement region 320 at regular intervals.

In an embodiment, the first electrode 230 may be disposed in at least one region of the back surface of the first organic material arrangement region 220. In an example, the first electrode 230 may be disposed to be asymmetrical with respect to a straight line passing through the center of the first organic material arrangement region 220 or be asymmetrical with respect to the straight line perpendicular to the one straight line. In an example, the first electrode 230 may be irregularly disposed in a region of the back surface of the first organic material arrangement region 220. The first electrode 230 may be misaligned in the first region 120a.

Figure 6:
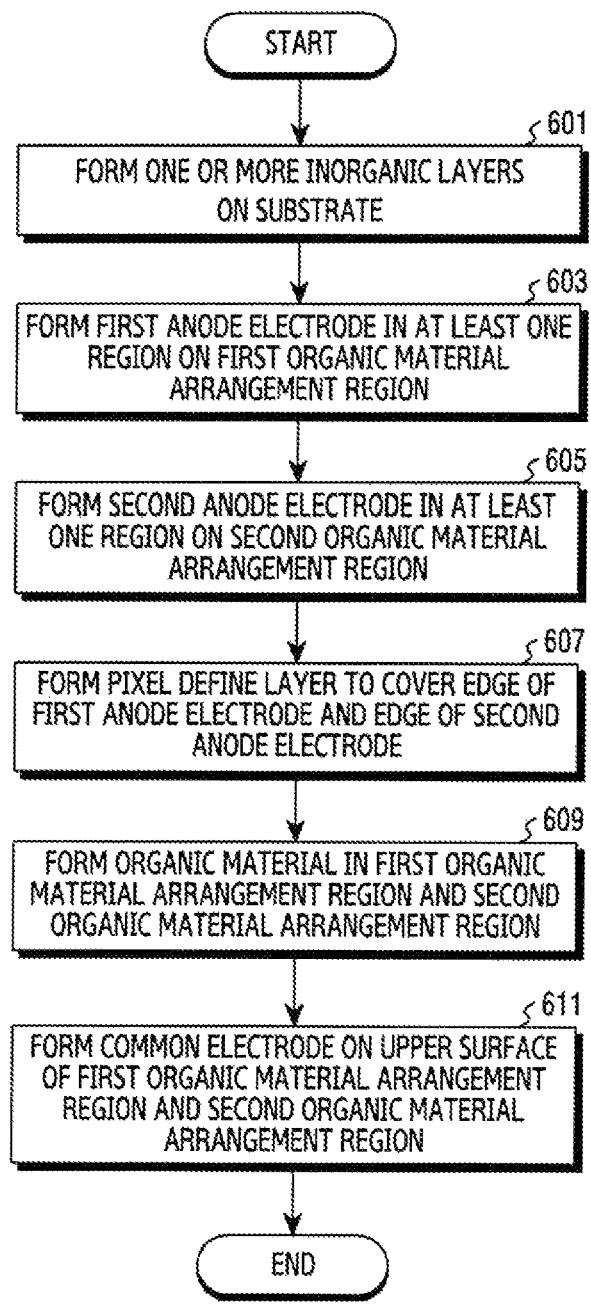
FIG. 6 is a flowchart illustrating a method of manufacturing a display panel according to an embodiment.

FIG. 6 is a flowchart illustrating a method of manufacturing the display panel 120 according to an embodiment.

In an embodiment, the method of manufacturing the display panel 120 may include an operation 601 of forming one or more inorganic layers on a substrate, an operation 603 of forming a first anode electrode 230 in at least one region on the first organic material arrangement region 220, an operation 605 of forming a second anode electrode 330 in at least one region on the second organic material arrangement region 320, an operation 607 of forming pixel define layers 240 and 340 to cover an edge of the first anode electrode 230 and an edge of the second anode electrode 330, an operation 609 of forming an organic material in the first organic material arrangement region 220 and the second organic material arrangement region 320, and an operation 611 of forming the common electrode 210 on upper surfaces of the first organic material arrangement region 220 and the second organic material arrangement region 320.

In an embodiment, the area of the first organic material arrangement region 220 may be larger than the area of the second organic material arrangement region 320. Accordingly, the first electrodes 230 may be irregularly disposed in regions of the first organic material arrangement region 220. In another embodiment, the area of the first organic material arrangement region 220c may be substantially the same as the area of the second organic material arrangement region 320. The area of the first electrode 230c may be smaller than the area of the second electrode 330. The first electrode 230c may be irregularly disposed in regions of the first organic material arrangement region 220c.

In an embodiment, the operation 609 of forming the organic material in the first organic material arrangement region 220 and the second organic material arrangement region 320 may include a step of disposing a fine metal mask (FMM) to overlap with the first organic material arrangement region 220 and the second organic material arrangement region 320 and depositing an organic light emitting material.

In an embodiment, the fine metal mask (FMM) disposed in the first organic material arrangement region 220 and the second organic material arrangement region 320 may be disposed regularly or in an aligned form. In this case, the first organic material arrangement region 220 and the second organic material arrangement region 320 may be disposed regularly or in an aligned state. The first electrode 230 and the first pixel define layer 240 may be arranged irregularly or in a misaligned state in regions of the back surface of the regularly arranged first organic material arrangement region 220. In an example, the first electrode 230 and the first pixel define layer 240 may be disposed in a regular or aligned state in regions of the back surface of the regularly arranged first organic material arrangement region 220. In an embodiment, the first organic material arrangement region 220 and the second organic material arrangement region 320 may be arranged in the regular or aligned state, thereby decreasing tolerances and/or defects and increasing ease of manufacture of the display panel 120.

In another embodiment, the FMM disposed in the first organic material arrangement region 220 may be disposed in an irregular, misaligned form. In this case, the first organic material arrangement region 220 may be arranged in an irregular or misaligned state. The first electrode 230 and the first pixel define layer 240 may be disposed regularly or in an aligned state in regions of the back surface of the irregularly arranged first organic material arrangement region 220. In an example, the first electrode 230 and the first pixel define layer 240 may be disposed irregularly or in a misaligned state in regions of the back surface of the irregularly arranged first organic material arrangement region 220.

In an embodiment, the operation 609 of forming the organic material in the first organic material arrangement region 220 and the second organic material arrangement region 320 may include an operation of disposing to overlap a mask having a first opening region corresponding to the first organic material arrangement region 220 with the first organic material arrangement region 220 and depositing an organic light emitting material. Also, the operation 609 of forming the organic material may include an operation of disposing to overlap a mask having a second opening region corresponding to the second organic material arrangement region 320 with the second organic material arrangement region 320 and depositing an organic light emitting material.

Figure 7:
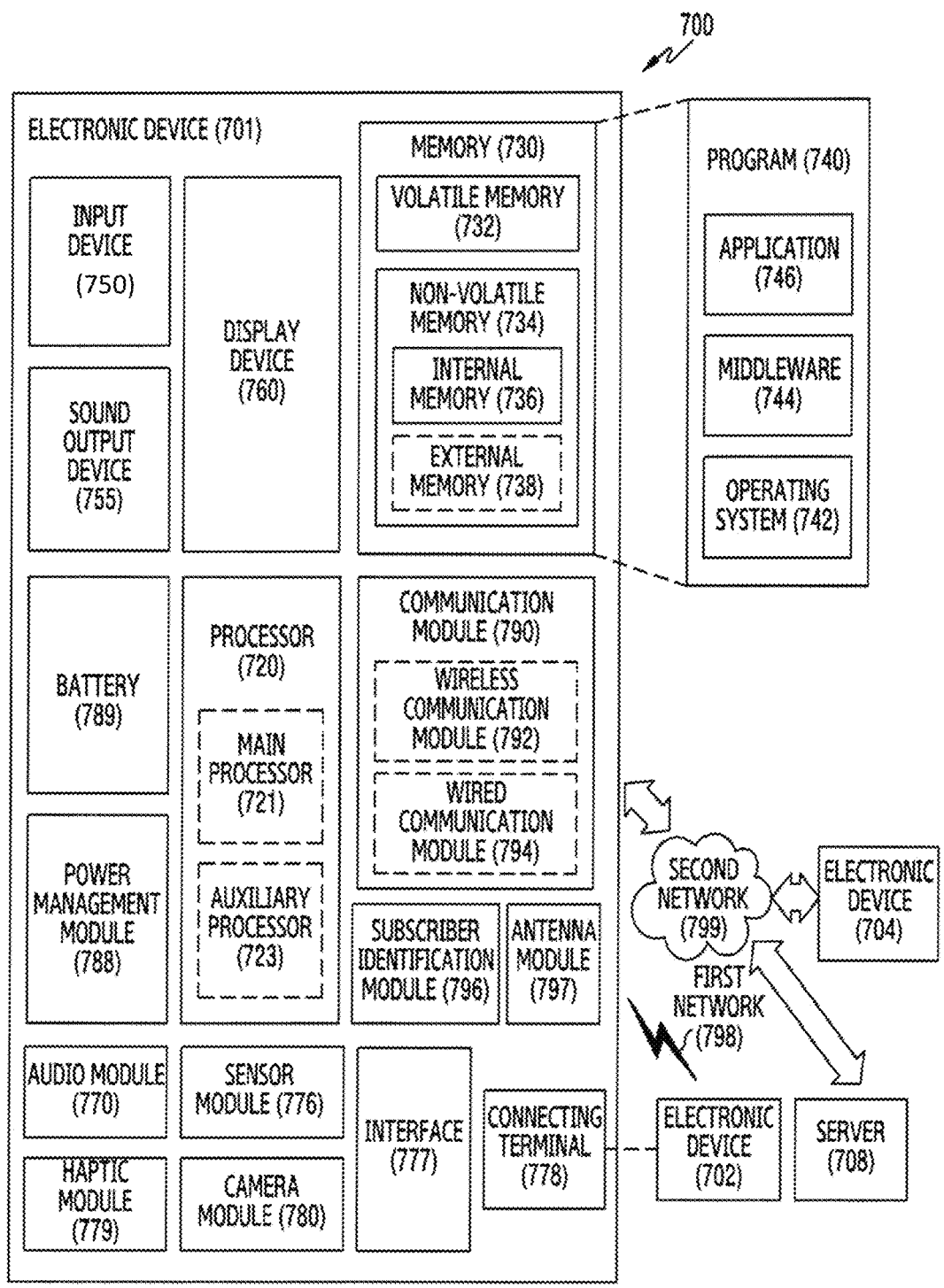
FIG. 7 is a block diagram of an electronic device in a network environment according to an embodiment.

FIG. 7 is a block diagram of an electronic device in a network environment according to an embodiment.

Referring to FIG. 7, the electronic device 701 in the network environment 700 may communicate with an electronic device 702 via a first network 798 (e.g., a short-range wireless communication network), or at least one of an electronic device 704 or a server 708 via a second network 799 (e.g., a long-range wireless communication network). According to an embodiment, the electronic device 701 may communicate with the electronic device 704 via the server 708. According to an embodiment, the electronic device 701 may include a processor 720, memory 730, an input module 750, a sound output module 755, a display module 760, an audio module 770, a sensor module 776, an interface 777, a connecting terminal 778, a haptic module 779, a camera module 780, a power management module 788, a battery 789, a communication module 790, a subscriber identification module (SIM) 796, or an antenna module 797. In some embodiments, at least one of the components (e.g., the connecting terminal 778) may be omitted from the electronic device 701, or one or more other components may be added in the electronic device 701. In some embodiments, some of the components (e.g., the sensor module 776, the camera module 780, or the antenna module 797) may be implemented as a single component (e.g., the display module 760).

The processor 720 may execute, for example, software (e.g., a program 740) to control at least one other component (e.g., a hardware or software component) of the electronic device 701 coupled with the processor 720, and may perform various data processing or computation. According to one embodiment, as at least part of the data processing or computation, the processor 720 may store a command or data received from another component (e.g., the sensor module 776 or the communication module 790) in volatile memory 732, process the command or the data stored in the volatile memory 732, and store resulting data in non-volatile memory 734. According to an embodiment, the processor 720 may include a main processor 721 (e.g., a central processing unit (CPU) or an application processor (AP)), or an auxiliary processor 723 (e.g., a graphics processing unit (GPU), a neural processing unit (NPU), an image signal processor (ISP), a sensor hub processor, or a communication processor (CP)) that is operable independently from, or in conjunction with, the main processor 721. For example, when the electronic device 701 includes the main processor 721 and the auxiliary processor 723, the auxiliary processor 723 may be adapted to consume less power than the main processor 721, or to be specific to a specified function. The auxiliary processor 723 may be implemented as separate from, or as part of the main processor 721.

The auxiliary processor 723 may control at least some of functions or states related to at least one component (e.g., the display module 760, the sensor module 776, or the communication module 790) among the components of the electronic device 701, instead of the main processor 721 while the main processor 721 is in an inactive (e.g., sleep) state, or together with the main processor 721 while the main processor 721 is in an active state (e.g., executing an application). According to an embodiment, the auxiliary processor 723 (e.g., an image signal processor or a communication processor) may be implemented as part of another component (e.g., the camera module 780 or the communication module 790) functionally related to the auxiliary processor 723. According to an embodiment, the auxiliary processor 723 (e.g., the neural processing unit) may include a hardware structure specified for artificial intelligence model processing. An artificial intelligence model may be generated by machine learning. Such learning may be performed, e.g., by the electronic device 701 where the artificial intelligence is performed or via a separate server (e.g., the server 708). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 730 may store various data used by at least one component (e.g., the processor 720 or the sensor module 776) of the electronic device 701. The various data may include, for example, software (e.g., the program 740) and input data or output data for a command related thereto. The memory 730 may include the volatile memory 732 or the non-volatile memory 734.

The program 740 may be stored in the memory 730 as software, and may include, for example, an operating system (OS) 742, middleware 744, or an application 746.

The input module 750 may receive a command or data to be used by another component (e.g., the processor 720) of the electronic device 701, from the outside (e.g., a user) of the electronic device 701. The input module 750 may include, for example, a microphone, a mouse, a keyboard, a key (e.g., a button), or a digital pen (e.g., a stylus pen).

The sound output module 755 may output sound signals to the outside of the electronic device 701. The sound output module 755 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 760 may visually provide information to the outside (e.g., a user) of the electronic device 701. The display module 760 may include, for example, a display, a hologram device, or a projector and control circuitry to control a corresponding one of the display, hologram device, and projector. According to an embodiment, the display module 760 may include a touch sensor adapted to detect a touch, or a pressure sensor adapted to measure the intensity of force incurred by the touch.

The audio module 770 may convert a sound into an electrical signal and vice versa. According to an embodiment, the audio module 770 may obtain the sound via the input module 750, or output the sound via the sound output module 755 or a headphone of an external electronic device (e.g., an electronic device 702) directly (e.g., wiredly) or wirelessly coupled with the electronic device 701.

The sensor module 776 may detect an operational state (e.g., power or temperature) of the electronic device 701 or an environmental state (e.g., a state of a user) external to the electronic device 701, and then generate an electrical signal or data value corresponding to the detected state. According to an embodiment, the sensor module 776 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 777 may support one or more specified protocols to be used for the electronic device 701 to be coupled with the external electronic device (e.g., the electronic device 702) directly (e.g., wiredly) or wirelessly. According to an embodiment, the interface 777 may include, for example, a high definition multimedia interface (HDMI), a universal serial bus (USB) interface, a secure digital (SD) card interface, or an audio interface.

A connecting terminal 778 may include a connector via which the electronic device 701 may be physically connected with the external electronic device (e.g., the electronic device 702). According to an embodiment, the connecting terminal 778 may include, for example, a HDMI connector, a USB connector, a SD card connector, or an audio connector (e.g., a headphone connector).

The haptic module 779 may convert an electrical signal into a mechanical stimulus (e.g., a vibration or a movement) or electrical stimulus which may be recognized by a user via his tactile sensation or kinesthetic sensation. According to an embodiment, the haptic module 779 may include, for example, a motor, a piezoelectric element, or an electric stimulator.

The camera module 780 may capture a still image or moving images. According to an embodiment, the camera module 780 may include one or more lenses, image sensors, image signal processors, or flashes.

The power management module 788 may manage power supplied to the electronic device 701. According to one embodiment, the power management module 788 may be implemented as at least part of, for example, a power management integrated circuit (PMIC).

The battery 789 may supply power to at least one component of the electronic device 701. According to an embodiment, the battery 789 may include, for example, a primary cell which is not rechargeable, a secondary cell which is rechargeable, or a fuel cell.

The communication module 790 may support establishing a direct (e.g., wired) communication channel or a wireless communication channel between the electronic device 701 and the external electronic device (e.g., the electronic device 702, the electronic device 704, or the server 708) and performing communication via the established communication channel. The communication module 790 may include one or more communication processors that are operable independently from the processor 720 (e.g., the application processor (AP)) and supports a direct (e.g., wired) communication or a wireless communication. According to an embodiment, the communication module 790 may include a wireless communication module 792 (e.g., a cellular communication module, a short-range wireless communication module, or a global navigation satellite system (GNSS) communication module) or a wired communication module 794 (e.g., a local area network (LAN) communication module or a power line communication (PLC) module). A corresponding one of these communication modules may communicate with the external electronic device via the first network 798 (e.g., a short-range communication network, such as Bluetooth™, wireless-fidelity (Wi-Fi) direct, or infrared data association (IrDA)) or the second network 799 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 792 may identify and authenticate the electronic device 701 in a communication network, such as the first network 798 or the second network 799, using subscriber information (e.g., international mobile subscriber identity (IMSI)) stored in the subscriber identification module 796.

The wireless communication module 792 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 792 may support a high-frequency band (e.g., the mmWave band) to achieve, e.g., a high data transmission rate. The wireless communication module 792 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 792 may support various requirements specified in the electronic device 701, an external electronic device (e.g., the electronic device 704), or a network system (e.g., the second network 799). According to an embodiment, the wireless communication module 792 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 797 may transmit or receive a signal or power to or from the outside (e.g., the external electronic device) of the electronic device 701. According to an embodiment, the antenna module 797 may include an antenna including a radiating element composed of a conductive material or a conductive pattern formed in or on a substrate (e.g., a printed circuit board (PCB)). According to an embodiment, the antenna module 797 may include a plurality of antennas (e.g., array antennas). In such a case, at least one antenna appropriate for a communication scheme used in the communication network, such as the first network 798 or the second network 799, may be selected, for example, by the communication module 790 (e.g., the wireless communication module 792) from the plurality of antennas. The signal or the power may then be transmitted or received between the communication module 790 and the external electronic device via the selected at least one antenna. According to an embodiment, another component (e.g., a radio frequency integrated circuit (RFIC)) other than the radiating element may be additionally formed as part of the antenna module 797.

According to certain embodiments, the antenna module 797 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 701 and the external electronic device 704 via the server 708 coupled with the second network 799. Each of the electronic devices 702 or 704 may be a device of a same type as, or a different type, from the electronic device 701. According to an embodiment, all or some of operations to be executed at the electronic device 701 may be executed at one or more of the external electronic devices 702, 704, or 708. For example, if the electronic device 701 should perform a function or a service automatically, or in response to a request from a user or another device, the electronic device 701, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 701. The electronic device 701 may provide the outcome, with or without further processing of the outcome, as at least part of a reply to the request. To that end, a cloud computing, distributed computing, mobile edge computing (MEC), or client-server computing technology may be used, for example. The electronic device 701 may provide ultra low-latency services using, e.g., distributed computing or mobile edge computing. In another embodiment, the external electronic device 704 may include an internet-of-things (IoT) device. The server 708 may be an intelligent server using machine learning and/or a neural network. According to an embodiment, the external electronic device 704 or the server 708 may be included in the second network 799. The electronic device 701 may be applied to intelligent services (e.g., smart home, smart city, smart car, or healthcare) based on 5G communication technology or IoT-related technology.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 740) including one or more instructions that are stored in a storage medium (e.g., internal memory 736 or external memory 738) that is readable by a machine (e.g., the electronic device 701). For example, a processor (e.g., the processor 720) of the machine (e.g., the electronic device 701) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities, and some of the multiple entities may be separately disposed in different components. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration.

An electronic device 101 of an embodiment may include an optical sensor 150, and an organic light emitting diode display panel 120 including a first region 120a corresponding to where the optical sensor is disposed and a second region 120b distinct from the first region. The organic light emitting diode display panel may include first organic material arrangement regions 220 disposed in the first region, second organic material arrangement regions 320 disposed in the second region, first electrodes 230 disposed on a back surface of the first organic material arrangement regions, second electrodes 330 disposed on a back surface of the second organic material arrangement regions, and a common electrode 210 disposed on an upper surface of the first organic material arrangement regions and the second organic material arrangement regions. An area of the first organic material arrangement regions may be larger than an area of the second organic material arrangement regions.

According to an embodiment, the first electrode may be irregularly disposed in a region of the first organic material arrangement region, and thus may be misaligned with respect to the first organic material arrangement region.

According to an embodiment, the second electrode may be regularly disposed in a region of the second organic material arrangement region, and may be aligned with respect to the second organic material arrangement region.

According to an embodiment, the first electrode may be disposed asymmetrically with respect to the center of the first organic material arrangement region in the region of the first organic material arrangement region, and the second electrode may be disposed symmetrically with respect to the center of the second organic material arrangement region in a region of the second organic material arrangement region.

According to an embodiment, an area of the first electrode may be smaller than an area of the first organic material arrangement region.

According to an embodiment, an area of the second electrode may be equal to or greater than an area of the second organic material arrangement region.

According to an embodiment, the first organic material arrangement regions may be disposed to be spaced apart from each other, and at least one region of the second organic material arrangement region may overlap each other.

According to an embodiment, a first pixel define layer disposed between the first electrodes and a second pixel define layer disposed between the second electrodes may be included.

According to an embodiment, the common electrode may include a transparent electrode or a semitransparent electrode.

According to an embodiment, an insulating layer disposed on the back surface of the first electrode may be further included.

An organic light emitting diode display device 101 of an embodiment may include a camera 150, and an organic light emitting diode display panel 120 including a first region 120a corresponding to where the camera is disposed and a second region 120b distinct from the first region. The organic light emitting diode display panel may include an organic layer including first organic material arrangement regions 220 disposed in the first region and second organic material arrangement regions 320 disposed in the second region, a first electrode layer including first electrodes 230 disposed on a back surface of the first organic material arrangement regions and second electrodes 330 disposed on a back surface of the second organic material arrangement regions, and a common electrode layer 210 disposed on an upper surface of the organic layer. An area of the first organic material arrangement regions may be larger than an area of the second organic material arrangement regions.

According to an embodiment, the first electrode may be irregularly disposed and be misaligned in a region of the first organic material arrangement region.

According to an embodiment, the second electrode may be regularly arranged and be aligned in a region of the second organic material arrangement region.

According to an embodiment, the first electrode may be disposed asymmetrically with respect to the center of the first organic material arrangement region in a region of the first organic material arrangement region, and the second electrode may be disposed symmetrically with respect to the center of the second organic material arrangement region in a region of the second organic material arrangement region.

According to an embodiment, an area of the first electrode may be smaller than an area of the first organic material arrangement region.

According to an embodiment, the first organic material arrangement region may be disposed to be spaced apart from each other, and at least one region of the second organic material arrangement region may overlap each other.

According to an embodiment, the first electrode layer may include a first pixel define layer disposed between the first electrodes and a second pixel define layer disposed between the second electrodes.

A method for manufacturing an organic light emitting diode display panel of an embodiment may include an operation (601) of forming one or more inorganic layers in a first organic material arrangement region and a second organic material arrangement region on a substrate, an operation (603) of forming a first anode electrode in a first area of the first organic material arrangement region, an operation (605) of forming a second anode electrode in a second area of the second organic material arrangement region, the second organic material arrangement region being smaller than the first organic material arrangement region, an operation (607) of forming a pixel define layer to cover an edge of the first anode electrode and an edge of the second anode electrode, an operation (609) of forming an organic material in the first organic material arrangement region and the second organic material arrangement region, and an operation (611) of forming a common electrode on an upper surface of the first organic material arrangement region and the second organic material arrangement region.

According to an embodiment, the operation of forming the organic material in the first organic material arrangement region and the second organic material arrangement region may include an operation of disposing a fine metal mask (FMM) to overlap with the first organic material arrangement region and the second organic material arrangement region and depositing an organic light emitting material.

According to an embodiment, the operation of forming the organic material in the first organic material arrangement region and the second organic material arrangement region may include an operation of disposing a mask having a first opening region corresponding to the first organic material arrangement region to overlap with the first organic material arrangement region and depositing the organic light emitting material and an operation of disposing a mask having a second opening region corresponding to the second organic material arrangement region to overlap with the second organic material arrangement region and depositing the organic light emitting material.

While the present disclosure has been shown and described with reference to various embodiments thereof, it will be understood by those skilled in the art that various changes in form and details may be made therein without departing from the present disclosure as defined by the appended claims and their equivalents.

The invention claimed is:

1. An electronic device comprising:
    an optical sensor; and
    an organic light emitting diode display panel including a first region corresponding to where the optical sensor is disposed and a second region distinct from the first region, the organic light emitting diode display panel further comprising:
        first organic material arrangement regions disposed in the first region;
        second organic material arrangement regions disposed in the second region;
        first electrodes disposed on a back surface of the first organic material arrangement regions;
        second electrodes disposed on a back surface of the second organic material arrangement regions; and
        a common electrode disposed on an upper surface of the first organic material arrangement regions and the second organic material arrangement regions,
    wherein an area of the first organic material arrangement regions is larger than an area of the second organic material arrangement regions, and
    wherein one of the first electrodes is disposed asymmetrically with respect to a center of one of the first organic material arrangement regions within a region of the one of the first organic material arrangement regions, and one of the second electrodes is disposed symmetrically with respect to a center of one of the second organic material arrangement regions within a region of the one of the second organic material arrangement regions.

2. The electronic device of claim 1, wherein one of the first electrodes is irregularly disposed in a region of one of the first organic material arrangement regions, and is misaligned with respect to the one of the first organic material arrangement regions.

3. The electronic device of claim 2, wherein one of the second electrodes is regularly disposed in a region of one of the second organic material arrangement regions and is aligned with respect to the one of the second organic material arrangement regions.

4. The electronic device of claim 1, wherein an area of the first electrodes is smaller than an area of the first organic material arrangement regions.

5. The electronic device of claim 4, wherein an area of the second electrodes is equal to or greater than an area of the second organic material arrangement regions.

6. The electronic device of claim 1, wherein the first organic material arrangement regions are spaced apart from each other, and the second organic material arrangement regions are overlapped in at least one region with each other.

7. The electronic device of claim 1, further comprising a first pixel define layer disposed between the first electrodes and a second pixel define layer disposed between the second electrodes.

8. The electronic device of claim 1, wherein the common electrode comprises a transparent electrode or a semitransparent electrode.

9. The electronic device of claim 1, further comprising an insulating layer disposed on a back surface of the first electrodes.

10. An organic light emitting diode display device comprising:
    a camera; and
    an organic light emitting diode display panel including a first region corresponding to where the camera is disposed and a second region distinct from the first region, the organic light emitting diode display panel further comprising:
        an organic layer comprising first organic material arrangement regions disposed in the first region and second organic material arrangement regions disposed in the second region;
        a first electrode layer comprising first electrodes disposed on a back surface of the first organic material arrangement regions and second electrodes disposed on a back surface of the second organic material arrangement regions; and
        a common electrode layer disposed on an upper surface of the organic layer,
    wherein an area of the first organic material arrangement regions is larger than an area of the second organic material arrangement regions, and
    wherein one of the first electrodes is disposed asymmetrically with respect to a center of one of the first organic material arrangement regions within a region of the one of the first organic material arrangement regions, and one of the second electrodes is disposed symmetrically with respect to a center of one of the second organic material arrangement regions within a region of the one of the second organic material arrangement regions.

11. The organic light emitting diode display device of claim 10, wherein one of the first electrodes is irregularly disposed and misaligned in a region of one of the first organic material arrangement regions.

12. The organic light emitting diode display device of claim 11, wherein one of the second electrodes is regularly disposed and aligned in a region of one of the second organic material arrangement regions.

13. The organic light emitting diode display device of claim 10, wherein an area of the first electrodes is smaller than an area of the first organic material arrangement regions.

14. The organic light emitting diode display device of claim 10, wherein the first organic material arrangement regions are spaced apart from each other, and the second organic material arrangement regions are overlapped in at least one region with each other.

15. The organic light emitting diode display device of claim 10, wherein the first electrode layer comprises a first pixel define layer disposed between the first electrodes and a second pixel define layer disposed between the second electrodes.

16. A method for manufacturing an organic light emitting diode display panel, the method comprising:
    forming one or more inorganic layers in first organic material arrangement regions and second organic material arrangement regions on a substrate;
    forming first anode electrodes in a first area of the first organic material arrangement regions;
    forming second anode electrodes in a second area of the second organic material arrangement regions, the second organic material arrangement regions being smaller than the first organic material arrangement regions;
forming a pixel define layer to cover an edge of each first anode electrode and an edge of each second anode electrode;
forming an organic material in the first organic material arrangement regions and the second organic material arrangement regions; and
forming a common electrode on an upper surface of the first organic material arrangement regions and the second organic material arrangement regions, and
wherein one of the first anode electrodes is disposed asymmetrically with respect to a center of one of the first organic material arrangement regions within a region of the one of the first organic material arrangement regions, and one of the second anode electrodes is disposed symmetrically with respect to a center of one of the second organic material arrangement regions within a region of the one of the second organic material arrangement regions.

17. The method of manufacturing the organic light emitting diode display panel of claim 16, wherein the forming of the organic material in the first organic material arrangement regions and the second organic material arrangement regions further comprises disposing a fine metal mask (FMM) to overlap with the first organic material arrangement regions and the second organic material arrangement regions and depositing an organic light emitting material.

18. The method of manufacturing the organic light emitting diode display panel of claim 17, wherein the forming of the organic material in the first organic material arrangement regions and the second organic material arrangement regions further comprises:
 disposing a mask having a first opening region corresponding to the first organic material arrangement regions to overlap with the first organic material arrangement regions and depositing the organic light emitting material; and
 disposing a mask having a second opening region corresponding to the second organic material arrangement regions to overlap with the second organic material arrangement regions and depositing the organic light emitting material.

* * * * *